United States Patent
Jeong et al.

(10) Patent No.: US 9,214,960 B2
(45) Date of Patent: Dec. 15, 2015

(54) APPARATUS AND METHOD FOR TRANSMITTING AND RECEIVING DATA IN COMMUNICATION/BROADCASTING SYSTEM

(71) Applicant: Samsung Electronics Co., Ltd., Gyeonggi-do (KR)

(72) Inventors: Hong-Sil Jeong, Seoul (KR); Sung-Ryul Yun, Gyeonggi-do (KR); Hyun-koo Yang, Seoul (KR); Alain Mourad, Staines (GB); Ismael Gutierrez, Richmond (GB)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/332,017

(22) Filed: Jul. 15, 2014

(65) Prior Publication Data

US 2015/0012803 A1 Jan. 8, 2015

Related U.S. Application Data

(62) Division of application No. 13/352,941, filed on Jan. 18, 2012, now Pat. No. 8,782,499.

(30) Foreign Application Priority Data

Jan. 18, 2011 (KR) .................. 10-2011-0005049
Feb. 18, 2011 (KR) .................. 10-2011-0014393
Mar. 24, 2011 (KR) .................. 10-2011-0026181

(51) Int. Cl.
*H03M 13/00* (2006.01)
*H03M 13/03* (2006.01)
(Continued)

(52) U.S. Cl.
CPC ...... *H03M 13/1148* (2013.01); *H03M 13/1162* (2013.01); *H03M 13/1165* (2013.01);
(Continued)

(58) Field of Classification Search
CPC .......... H03M 13/618; H03M 13/6356; H03M 13/6362; H03M 13/6393; H03M 13/1162; H03M 13/1165; H03M 13/6552; H03M 13/253; H03M 13/255; H03M 13/2906; H03M 13/2957; H03M 13/152; H03M 13/17; H04L 1/0008; H04L 1/0013; H04L 1/0069
USPC .......... 714/782, 752, 786, 821, 801, 790, 799
See application file for complete search history.

(56) References Cited

U.S. PATENT DOCUMENTS 7,318,186 B2 1/2008 Yokokawa et al.
7,702,986 B2 4/2010 Bjerke et al.
(Continued)

FOREIGN PATENT DOCUMENTS

CN 1619997 5/2005
CN 1701515 11/2005
(Continued)

OTHER PUBLICATIONS

ETSI, Digital Video Broadcasting (DVB); Second Generation Framing Structure, Channel Coding and Modulation Systems for Broadcasting; InteractiveServices, News Gathering and other Broadband Satellite Applications (DVB-S2), European Standard, Final Draft ETSI EN 302 307 V1.2.1, Apr. 2009.
(Continued)

*Primary Examiner* — John J Tabone, Jr.
(74) *Attorney, Agent, or Firm* — The Farrell Law Firm, P.C.

(57) ABSTRACT

An apparatus and method for transmitting and receiving data in a wireless communication is provided. The method includes Low Density Parity Check (LDPC)-encoding LDPC information bits to generate a codeword, determining a number ($N_{punc}$) of bits to be punctured in parity bits of the codeword, determining a number ($N_{punc\_group}$) of parity bit groups in which all bits are punctured, and puncturing the all bits within $0^{th}$ to $(N_{punc\_group}-1)^{th}$ parity bit groups indicated by a puncturing pattern, wherein the puncturing pattern is defined as an order of the parity bit groups defined as 29, 45, 43, 27, 32, 35, 40, 38, 0, 19, 8, 16, 41, 4, 26, 36, 30, 2, 13, 42, 46, 24, 37, 1, 33, 11, 44, 28, 20, 9, 34, 3, 17, 6, 21, 14, 23, 7, 22, 47, 5, 10, 12, 15, 18, 25, 31 and 39.

13 Claims, 12 Drawing Sheets

(51) Int. Cl.
*H04L 1/00* (2006.01)
*H03M 13/11* (2006.01)
*H03M 13/29* (2006.01)
*H03M 13/15* (2006.01)
*H03M 13/25* (2006.01)
*H03M 13/17* (2006.01)

(52) U.S. Cl.
CPC ............ *H03M13/152* (2013.01); *H03M 13/17* (2013.01); *H03M 13/253* (2013.01); *H03M 13/255* (2013.01); *H03M 13/2906* (2013.01); *H03M 13/2957* (2013.01); *H03M 13/618* (2013.01); *H03M 13/6356* (2013.01); *H03M 13/6362* (2013.01); *H03M 13/6393* (2013.01); *H03M 13/6552* (2013.01); *H04L 1/0008* (2013.01); *H04L 1/0013* (2013.01)

(56) References Cited

U.S. PATENT DOCUMENTS

| | | | | |
|---|---|---|---|---|
| 7,900,127 | B2* | 3/2011 | Shen et al. | 714/804 |
| 8,069,393 | B2* | 11/2011 | Eroz et al. | 714/758 |
| 8,448,049 | B2 | 5/2013 | Sakai et al. | |
| 8,479,076 | B2* | 7/2013 | Trachewsky et al. | 714/752 |
| 8,631,312 | B2* | 1/2014 | Shen et al. | 714/804 |
| 8,644,406 | B2* | 2/2014 | Ko et al. | 375/261 |
| 2004/0098659 | A1 | 5/2004 | Bjerke et al. | |
| 2005/0005189 | A1 | 1/2005 | Khermosh et al. | |
| 2005/0278604 | A1 | 12/2005 | Yokokawa et al. | |
| 2007/0101229 | A1* | 5/2007 | Niu et al. | 714/752 |
| 2009/0158129 | A1 | 6/2009 | Myung et al. | |
| 2009/0217130 | A1 | 8/2009 | Myung et al. | |
| 2010/0061400 | A1* | 3/2010 | Hong et al. | 370/466 |
| 2010/0061698 | A1* | 3/2010 | Morello et al. | 386/85 |
| 2010/0153815 | A1* | 6/2010 | Hedberg et al. | 714/752 |
| 2010/0306627 | A1* | 12/2010 | Sakai et al. | 714/781 |
| 2010/0329308 | A1 | 12/2010 | Kim et al. | |
| 2011/0047435 | A1 | 2/2011 | Eroz et al. | |
| 2011/0299628 | A1* | 12/2011 | Ko et al. | 375/298 |
| 2014/0016720 | A1* | 1/2014 | Ko et al. | 375/295 |

FOREIGN PATENT DOCUMENTS

| | | |
|---|---|---|
| CN | 1714512 | 12/2005 |
| CN | 100382472 | 4/2008 |
| CN | 100472971 | 3/2009 |
| CN | 101902230 | 12/2010 |
| JP | 2011-10287 | 1/2011 |

OTHER PUBLICATIONS

H.J. Helgert et al., "Shortened BCH Codes", IEEE Transactions on Information Theory, Nov. 1973.
Hossein Pishro-Nik et al., "Results on Punctured LDPC Codes", Nov. 1, 2004.
ETSI, Digital Video Broadcasting (DVD); Second Generation Framing Structure, Channel Coding and Modulation Systems for Broadcasting; Interactive Services, News Gathering and other Broadband Satellite Applications (DVD-S2), European Standard, Final Draft ETSI EN 302 307 V1.2.1, Aug. 2009, 7 pages.
Japanese Office Action dated Aug. 24, 2015 issued in counterpart application No. 2013-549372, 8 pages.
Australian Notice of Acceptance dated Jul. 11, 2015 issued in counterpart application No. 2012207771, 3 pages.
Hossein Pishro-Nik et al., "Results on Punctured LDPC Codes", 2004 IEEE Information Theory Workshop, Oct. 24-29, 2004, 5 pages.
H.J. Helgert et al., "Shortened BCH Codes", IEEE Transactions on Information Theory, vol. 19, No. 6, Nov. 1973, 3 pages.
Digital Video Broadcasting (DVD); Second Generation Framing Structure, Channel Coding and Modulation Systems for Broadcasting, Interactive Services, News Gathering and other Broadband Satellite Applications (DVD-S2), ETSI EN 302 307 V1.2.1, Aug. 2009, 78 pages.
Chinese Office Action dated Sep. 28, 2015 issued in counterpart application No. 201280005688.1, 26 pages.

* cited by examiner $$\begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix} \cdot \begin{bmatrix} C_0 \\ C_1 \\ C_2 \\ C_3 \\ C_4 \\ C_5 \\ C_6 \\ C_7 \end{bmatrix} = \begin{bmatrix} 0 \\ 0 \\ 0 \\ 0 \end{bmatrix}$$

$$\underline{C} = (\overbrace{(C_0, C_1, C_2, C_3)}^{\text{INFORMATION}}, \overbrace{(C_4, C_5, C_6, C_7)}^{\text{PARITY}})$$

FIG.3A $$\cancel{C_0 \cdot \begin{bmatrix}1\\1\\1\\1\end{bmatrix}} + C_1 \cdot \begin{bmatrix}1\\1\\1\\0\end{bmatrix} + C_2 \cdot \begin{bmatrix}1\\0\\1\\1\end{bmatrix} + \cancel{C_3 \cdot \begin{bmatrix}1\\1\\0\\1\end{bmatrix}} + C_4 \cdot \begin{bmatrix}1\\0\\0\\1\end{bmatrix} + C_5 \cdot \begin{bmatrix}1\\1\\0\\0\end{bmatrix} + C_6 \cdot \begin{bmatrix}0\\1\\1\\0\end{bmatrix} + C_7 \cdot \begin{bmatrix}0\\0\\1\\1\end{bmatrix} = \begin{bmatrix}0\\0\\0\\0\end{bmatrix}$$

FIG.3B $$C_0 \cdot \begin{bmatrix}1\\1\\1\\1\end{bmatrix} + C_1 \cdot \begin{bmatrix}1\\1\\1\\0\end{bmatrix} + C_2 \cdot \begin{bmatrix}1\\0\\1\\1\end{bmatrix} + C_3 \cdot \begin{bmatrix}1\\1\\0\\1\end{bmatrix} + C_4 \cdot \begin{bmatrix}1\\0\\0\\1\end{bmatrix} + C_5 \cdot \begin{bmatrix}1\\1\\0\\0\end{bmatrix} + C_6 \cdot \begin{bmatrix}0\\1\\1\\0\end{bmatrix} + C_7 \cdot \begin{bmatrix}0\\0\\1\\1\end{bmatrix} = \begin{bmatrix}0\\0\\0\\0\end{bmatrix}$$

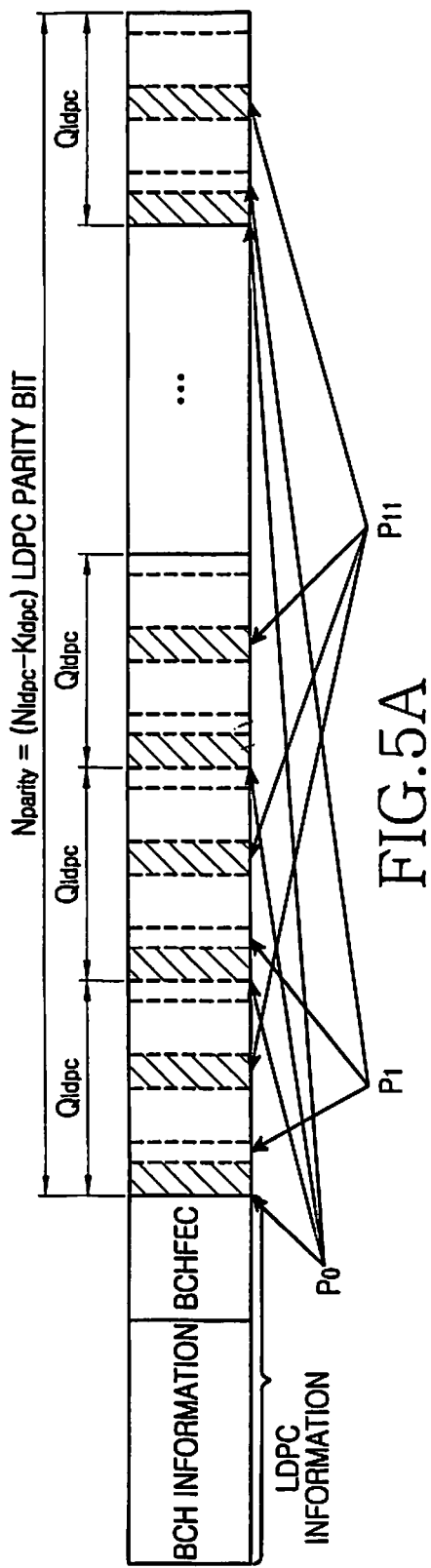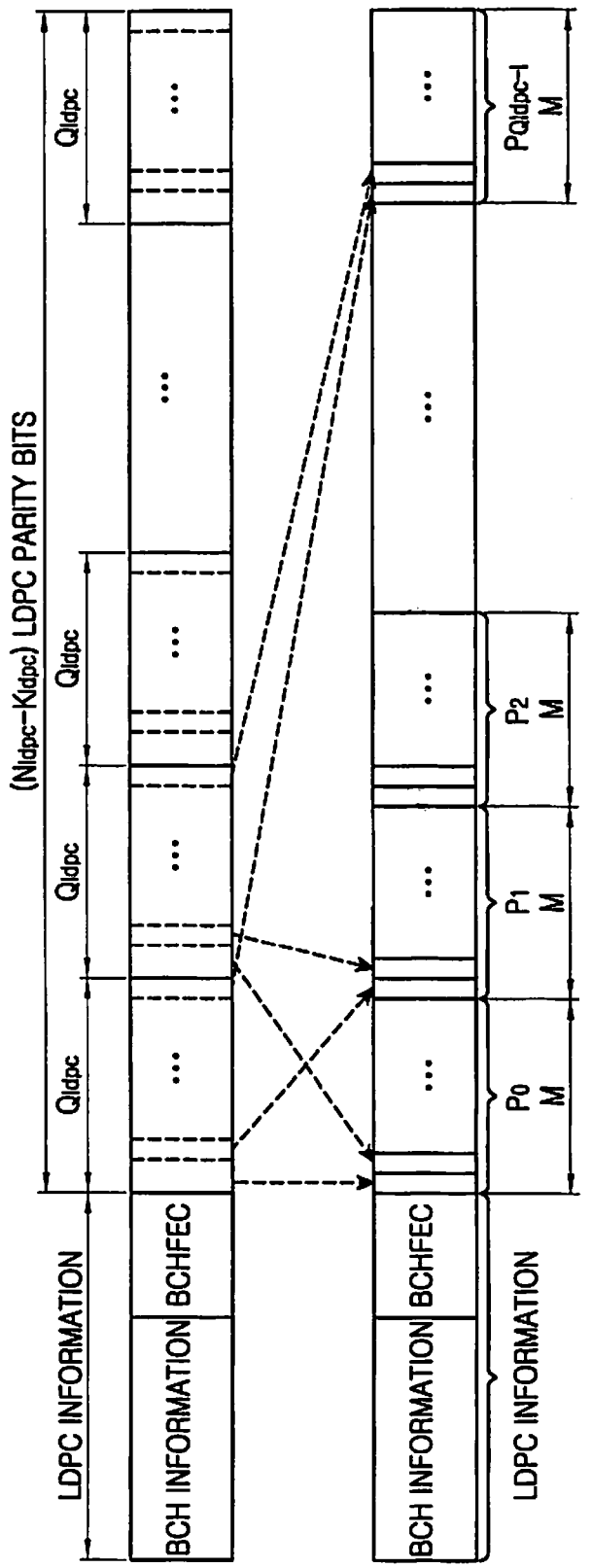

APPARATUS AND METHOD FOR TRANSMITTING AND RECEIVING DATA IN COMMUNICATION/BROADCASTING SYSTEM

PRIORITY

The present application is a Divisional Application of U.S. patent application Ser. No. 13/352,941 filed in the U.S. Patent and Trademark Office on Jan. 18, 2012, now U.S. Pat. No. 8,782,499, and claims priority under 35 U.S.C. §119(a) to Korean patent applications filed in the Korean Intellectual Property Office on Jan. 18, 2011 and assigned Serial No. 10-2011-0005049, on Feb. 18, 2011 and assigned Serial No. 10-2011-0014393 and on Mar. 24, 2011 and assigned Serial No. 10-2011-0026181, the contents of each of which are incorporated herein by reference.

BACKGROUND OF THE INVENTION

1. Field of the Invention

The present invention generally relates to a communication/broadcasting system.

2. Description of the Related Art

The link performance in a communication/broadcasting system is susceptible to deterioration due to any of channel noise, fading, and Inter-Symbol Interference (ISI). Accordingly, in order to realize high-speed digital communication/broadcasting systems requiring high-speed data throughput and reliability such as next-generation mobile communication, digital broadcasting, and portable Internet, technology is needed for overcoming such noise, fading, and ISI. To this end, research has been conducted on an error-correcting code as a method for efficiently restoring distortion of information and enhancing the reliability of communication/broadcasting.

A Low Density Parity Check (LDPC) code first introduced by Gallager in the 1960s was dismissed for many years due to complexity in realizing in those years. However, as a turbo code disclosed by Berrou, Glavieux, and Thitimajshima in 1993 showed performance close to the Shannon channel capacity, much interpretation was rendered on the performance and characteristic of the turbo code while intensive research was conducted on iterative decoding and graph-based channel coding. With this, the LDPC code was re-studied in the latter half of the 1990s, and was known to exhibit performance close to the Shannon channel capacity iterative decoding were applied based on the sum-product algorithm to perform decoding on a Tanner graph corresponding to the LDPC code.

The LDPC code is generally defined as a parity-check matrix and is expressed using a bipartite graph known as a Tanner graph. The LDPC encoder generates a LDPC codeword composed of $N_{ldpc}$ bits by receiving an input of an LDPC information word composed of the $K_{ldpc}$ bits. For convenience of description, assume that a codeword is composed of $N_{ldpc}$ bits by receiving an input of an LDPC information word composed of the $K_{ldpc}$ bits. That is, by performing LDPC coding for an LDPC information word ($I=[i_0,i_1,i_2,\ldots,i_{K_{ldpc}-1}]$) composed of input $K_{ldpc}$ bits, a LDPC codeword ($c=[c_0,c_1,c_2,c_3,\ldots,c_{N_{ldpc}-1}]$) is generated. That is, the LDPC codeword is a bit stream composed of a plurality of bits, and a LDPC codeword bit represents each of the bits constituting the codeword. Also, the LDPC information word is a bit stream composed of a plurality of bits, and an LDPC information word bit represents each of the bits constituting the information word. At this time, in a systematic code, a codeword is composed of $c=[c_0,c_1,c_2,c_3,\ldots,c_{N_{ldpc}-1}]$ [$i_0$, $i_1,\ldots,=i_{K_{ldpc}-1},p_0,p_1,\ldots,p_{N_{parity}-1}]$. Here, 'P=$[p_0,p_1,\ldots,p_{N_{parity}-1}]$' denotes parity bits, and the number of the parity bits is given as $N_{parity}=N_{ldpc}-K_{ldpc}$.

The LDPC coding includes a process of determining a codeword meeting a condition of Equation (1) as follows.

$$H \cdot c^T = 0 \text{ where } c=[c_0,c_1,c_2,\ldots,c_{N_{ldpc}-1}] \quad (1)$$

In Equation (1), 'H' denotes a parity-check matrix, 'c' denotes a codeword, '$c_i$' denotes an $i^{th}$ bit of the codeword, and '$N_{ldpc}$' denotes a codeword length.

The parity-check matrix (H) is composed of $N_{ldpc}$ columns, and represents that an $i^{th}$ column has a link with an $i^{th}$ codeword bit ($c_i$).

According to the LDPC code, coding is generally performed when it has been already determined that an information word length and a codeword length are equal to '$K_{dpc}$' and '$N_{ldpc}$', respectively. Therefore, a need exists for a suitable method when an information word of a shorter length than '$K_{ldpc}$' is input or is intended to generate a codeword of a shorter length than '$N_{ldpc}$'. For example, a transmitter shortens ($K_{ldpc}-K_I$) bits when the information word having a length of $K_I$ input to a coder. $K_I$ is less than the length ($K_{ldpc}$) of information word required for coding. Also, the transmitter punctures ($N_{parity}-N_{txparity}$) bits when a required parity length ($N_{txparity}$) is less than the parity length ($N_{parity}$). The '$N_{txparity}$' denotes a length of an actually transmitted parity, and is determined according to $K_I$ that is input and a coding rate that is necessary for transmission.

When some bits are shortened or punctured in consideration of information word length and parity length, the performance of a codeword is greatly varied according to which bits are shortened or punctured. Accordingly, there is a need for selecting the shortened bits and the punctured bits to maintain optimal performance.

SUMMARY OF THE INVENTION

The present invention is designed to substantially solve at least the above-described problems and/or disadvantages and to provide at least the advantages below. Accordingly, an aspect of the present invention is to provide an apparatus and method for selecting shortened and punctured bits while maintaining optimal performance in a communication/broadcasting system.

The above aspects are achieved by providing an apparatus and method for transmitting and receiving data in a communication/broadcasting system.

According to an aspect of the present invention, a method for an operation of a transmitter includes Low Density Parity Check (LDPC)-encoding LDPC information bits to generate a codeword, determining a number ($N_{punc}$) of bits to be punctured in parity bits of the codeword, determining a number ($N_{punc\_group}$) of parity bit groups in which all bits are punctured, and puncturing the all bits within $0^{th}$ to ($N_{punc\_group}-1)^{th}$ parity bit groups indicated by a puncturing pattern, wherein the puncturing pattern is defined as an order of the parity bit groups defined as 29, 45, 43, 27, 32, 35, 40, 38, 0, 19, 8, 16, 41, 4, 26, 36, 30, 2, 13, 42, 46, 24, 37, 1, 33, 11, 44, 28, 20, 9, 34, 3, 17, 6, 21, 14, 23, 7, 22, 47, 5, 10, 12, 15, 18, 25, 31 and 39.

According to another aspect of the present invention, a method for an operation of a receiver includes receiving a punctured codeword, determining a number of bits punctured in LDPC parity bits of the punctured codeword, determining a number ($N_{punc\_group}$) of parity bit groups in which all bits are punctured, setting LDPC decoder input values corresponding to all parity bits within $0^{th}$ to $(N_{punc\_group}-1)^{th}$ parity bit groups in an LDPC codeword indicated by a puncturing pattern by a value representing punctured parity bits, and setting LDPC decoder input values for the non-punctured remnant parity bits in the LDPC codeword according to reception values of the punctured codeword, wherein the puncturing pattern is defined as an order of the parity bit groups defined as 29, 45, 43, 27, 32, 35, 40, 38, 0, 19, 8, 16, 41, 4, 26, 36, 30, 2, 13, 42, 46, 24, 37, 1, 33, 11, 44, 28, 20, 9, 34, 3, 17, 6, 21, 14, 23, 7, 22, 47, 5, 10, 12, 15, 18, 25, 31 and 39.

According to another aspect of the present invention, an apparatus for a transmitter includes a coding unit for LDPC-encoding LDPC information bits to generate a codeword, a puncturing unit for determining a number ($N_{punc}$) of bits to be punctured in parity bits of the codeword, determining a number ($N_{punc\_group}$) of parity bit groups in which all bits are punctured, and puncturing the all bits within $0^{th}$ to $(N_{punc\_group}-1)^{th}$ parity bit groups indicated by a puncturing pattern to create a punctured codeword, and a transmitter for transmitting the punctured codeword, wherein the puncturing pattern is defined as an order of the parity bit groups defined as 29, 45, 43, 27, 32, 35, 40, 38, 0, 19, 8, 16, 41, 4, 26, 36, 30, 2, 13, 42, 46, 24, 37, 1, 33, 11, 44, 28, 20, 9, 34, 3, 17, 6, 21, 14, 23, 7, 22, 47, 5, 10, 12, 15, 18, 25, 31 and 39.

According to another aspect of the present invention, an apparatus for a receiver includes a receiver for receiving a punctured codeword, and a punctured bit restoring unit for determining a number of bits punctured in LDPC parity bits of the punctured codeword, determining a number ($N_{punc\_group}$) of parity bit groups in which all bits are punctured, setting LDPC decoder input values corresponding to all parity bits within $0^{th}$ to $(N_{punc\_group-1})^{th}$ parity bit groups in the LDPC codeword indicated by a puncturing pattern by a value representing punctured parity bits, and setting LDPC decoder input values for non-punctured remnant parity bits in the LDPC codeword according to reception values of a shortened and punctured codeword, wherein the puncturing pattern is defined as an order of the parity bit groups defined as 29, 45, 43, 27, 32, 35, 40, 38, 0, 19, 8, 16, 41, 4, 26, 36, 30, 2, 13, 42, 46, 24, 37, 1, 33, 11, 44, 28, 20, 9, 34, 3, 17, 6, 21, 14, 23, 7, 22, 47, 5, 10, 12, 15, 18, 25, 31 and 39.

Other aspects, advantages, and salient features of the invention will become apparent to those skilled in the art from the following detailed description, which, taken in conjunction with the annexed drawings, discloses embodiments of the invention.

BRIEF DESCRIPTION OF THE DRAWINGS

For a more complete understanding of the present disclosure and its advantages, reference is now made to the following description taken in conjunction with the accompanying drawings, in which like reference numerals represent like parts, wherein:

FIGS. 3A to 3C illustrate relational formulas between a parity-check matrix and a codeword in a communication/broadcasting system according to an embodiment of the present invention;

FIGS. 5A and 5B illustrate grouping of parity bits in a communication/broadcasting system according to an embodiment of the present invention;

Throughout the drawings, like reference numerals will be understood to refer to like parts, components and structures.

DETAILED DESCRIPTION OF EMBODIMENTS OF THE INVENTION

Preferred embodiments of the present invention will be described herein below with reference to the accompanying drawings. In the following description, well-known functions or constructions are not described in detail for the sake of clarity and conciseness.

The following will disclose technology for shortening or puncturing some bits without performance deterioration in a codeword dependent on an LDPC code in a communication/broadcasting system according to an embodiment of the present invention.

The present invention uses terms and names that are defined in a Digital Video Broadcasting the 2nd Generation Terrestrial (DVB-T2) system, which is a European digital broadcasting standard and a Digital Video Broadcasting Next Generation Handheld (DVB-NGH) system, which is presently under standardization. However, the present invention is not limited thereto, and is applicable to other related systems which have encoding or decoding scheme.

Figure 1:
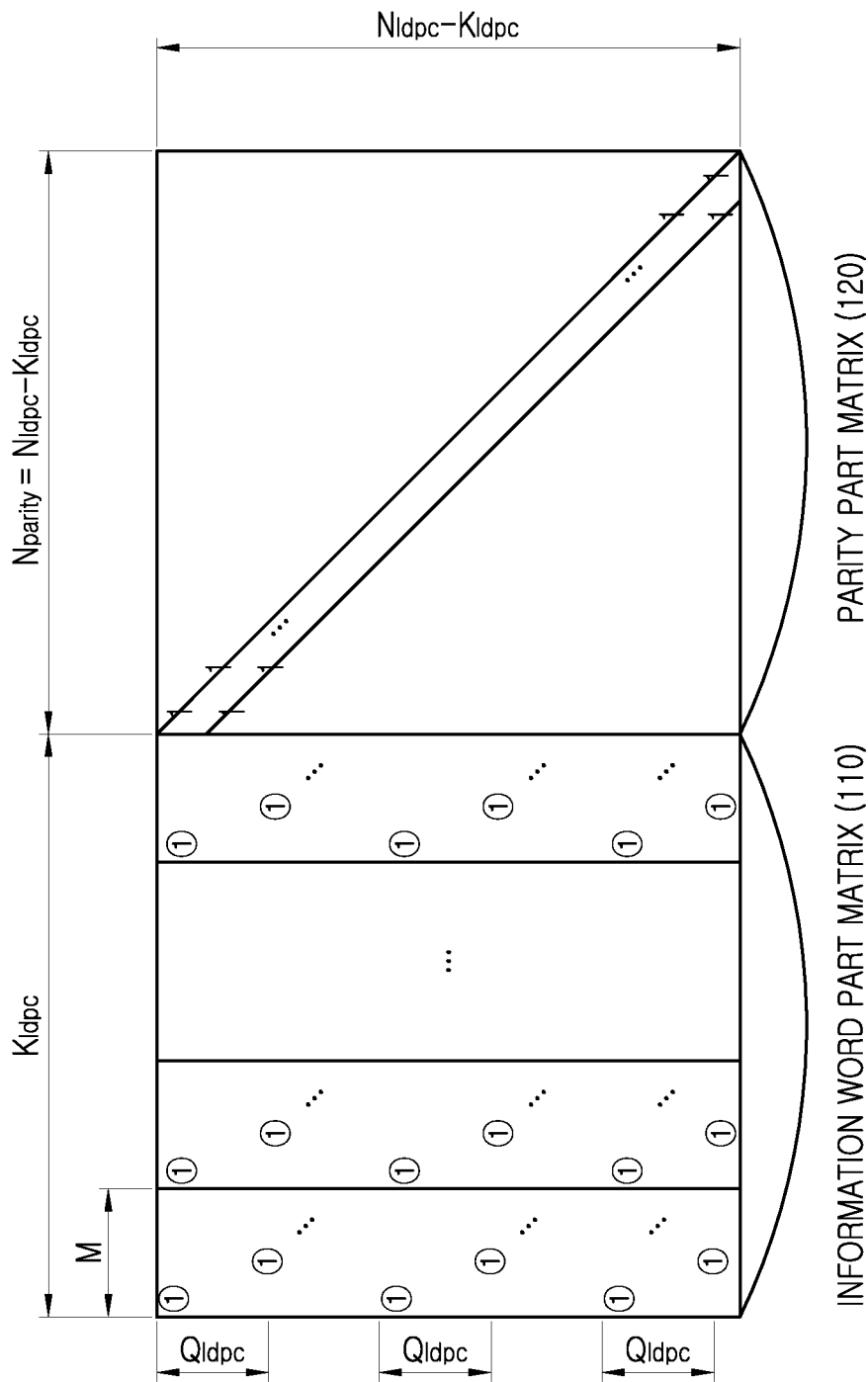
FIG. 1 illustrates an example of a parity-check matrix available in a communication/broadcasting system according to an embodiment of the present invention.

The present invention considers a parity-check matrix of a structure illustrated in FIG. 1, which is a systematic structure in which a codeword includes an intact information word. The present invention as follows will be described on the basis of the parity-check matrix of FIG. 1, but an applicable scope of the present invention is not limited thereto.

In FIG. 1, '$N_{ldpc}$' denotes a length of an LDPC codeword and also denotes a length of columns of the parity check matrix of FIG. 1, and '$K_{ldpc}$' denotes a length of an information word and also denotes a length of columns of information word part matrix 110 of FIG. 1. The length of the LDPC codeword or information word represents the number of bits included in the LDPC codeword or information word, so, information word can be generally called information bits. The 'M' denotes an interval in which a pattern of a column is repeated in an information word part matrix 110, and '$Q_{ldpc}$' denotes a size in which each column is shifted in the information word part matrix 110. Values of the integers (M and $Q_{ldpc}$) are determined such that $$Q_{ldpc} = \frac{N_{ldpc} - K_{ldpc}}{M}$$

is met.

$$\frac{K_{ldpc}}{M}$$

is also an integer. Values of the 'M' and '$Q_{ldpc}$' vary according to a codeword length and a coding rate.

Referring to FIG. 1, the parity-check matrix is distinguished into the information word part matrix 110 and a parity part matrix 120. The information word part matrix 110 includes $K_{ldpc}$ columns. The parity part matrix 120 includes $N_{parity}=N_{ldpc}-K_{ldpc}$ columns. The number of rows of the parity-check matrix is identical to the number ($N_{ldpc}-K_{ldpc}$) of columns of the parity part matrix 120.

In the parity part matrix 120 including a $K_{ldpc}^{th}$ column of the parity-check matrix to an $(N_{ldpc}-1)^{th}$ column, positions of elements having a weight-1, i.e., a value of '1' have a dual diagonal structure. Accordingly, degrees of the remnant columns excepting the $(N_{ldpc}-1)^{th}$ column among the columns included in the parity part matrix 120 are all equal to '2', and a degree of the last $(N_{ldpc}-1)^{th}$ column is equal to '1'.

Referring to FIG. 1, a structure of the information word part matrix 110, including a $0^{th}$ column to a $(K_{ldpc}-1)^{th}$ column in the parity-check matrix abides by the following rule. First, $K_{ldpc}$ columns corresponding to an information word in the parity-check matrix are divided into $$\frac{K_{ldpc}}{M}$$

column groups. The columns belonging to the same column group have relationship in which the columns are mutually shifted as much as '$Q_{ldpc}$'. Second, assuming that '$D_i$' denotes a degree of a $0^{th}$ column of an $$i^{th}\left(i = 0, 1, \ldots, \frac{K_{ldpc}}{M}\right)$$

column group and '$R_{i,0}^{(0)}, R_{i,0}^{(1)}, \ldots, R_{i,0}^{(D_i-1)}$' denotes a position of each row where '1' is positioned, an index ($R_{i,j}^{(k)}$) of a row in which a $k^{th}$ weight-1 is positioned in a $j^{th}$ column within the $i^{th}$ column group is determined as in Equation (2) as follows.

$$R_{i,j}^{(k)} = \left(R_{i,(j-1)}^{(k)} + Q_{ldpc}\right) \bmod (N_{ldpc} - K_{ldpc}) \quad (2)$$

$$(k = 0, 1, 2, \ldots D_i - 1)\left(i = 0, 1, \ldots, \frac{K_{ldpc}}{M}\right)(j = 1, 2, \ldots, M)$$

In Equation (2) above, '$R_{i,j}^{(k)}$' denotes the index of the row in which a $k^{th}$ weight-1 is positioned in the $j^{th}$ column within the $i^{th}$ column group, '$N_{ldpc}$' denotes a length of an LDPC codeword, '$K_{ldpc}$' denotes a length of an information word, '$D_i$' denotes degrees of columns belonging to the $i^{th}$ column group, and 'M' denotes the number of columns belonging to one column group.

According to the above rule, the degrees of the columns belonging to the $i^{th}$ column group are equal to '$D_i$' and are identical. An LDPC code storing information on the parity-check matrix according to the above rule is simply expressed as follows.

For example, when '$N_{ldpc}$' is equal to '30', '$K_{ldpc}$' is equal to '15', and '$Q_{ldpc}$' is equal to '3', position information of rows in which weight-1 are positioned in each of $0^{th}$ columns among three column groups is expressed as sequences known as a 'weight-1 position sequence', and shown in Equation (3) as follows.

$R_{1,0}^{(1)}=1, R_{1,0}^{(2)}=2, R_{1,0}^{(3)}=8, R_{1,0}^{(4)}=10,$ $R_{2,0}^{(1)}=0, R_{2,0}^{(2)}=9, R_{2,0}^{(3)}=13,$ $R_{3,0}^{(1)}=0, R_{3,0}^{(2)}=14,$ (3)

In Equation (3), '$R_{i,j}^{(k)}$' denotes an index of a row in which a $k^{th}$ weight-1' is positioned in a $j^{th}$ column within an $i^{th}$ column group.

The weight-1 position sequence of Equation 3 above denoting an index of a row in which '1' is positioned in a $0^{th}$ column of each of column groups is more simply expressed as in Table 1 as follows.

TABLE 1

1 2 8 10
0 9 13
0 14

Table 1 represents a position of an element having a weight-1, i.e., a value of '1' in a parity-check matrix. An $i^{th}$ weight-1 position sequence is expressed by an index of a row in which a weight-1 is positioned in a $0^{th}$ column belonging to an $i^{th}$ column group. Using Table 1, it is available to generate 15×15 information word part matrix of 30×15 parity check matrix. And, using Table 1, it is also available to generate entire 30×15 parity check matrix because the structure of 15×15 parity part matrix is determined to have dual diagonal structure.

Figure 2:
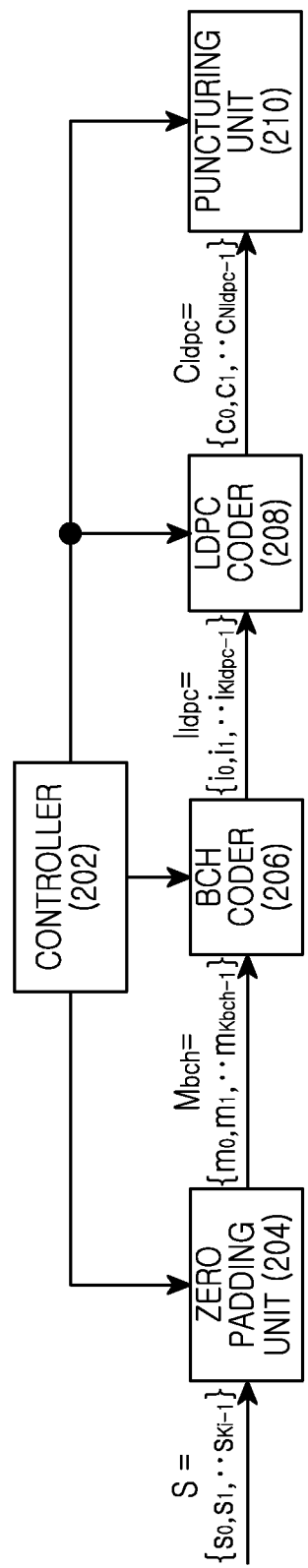
FIG. 2 illustrates a construction of a transmitter in a communication/broadcasting system according to an embodiment of the present invention.

FIG. 2 illustrates a transmitter in a communication/broadcasting system according to an embodiment of the present invention.

As illustrated in FIG. 2, the transmitter includes a controller 202, a zero (0) padding unit 204, a Bose, Chaudhuri, Hocquenghem (BCH) coder 206, an LDPC coder 208, and a puncturing unit 210. An encoder is normally comprised of BCH encoder 206 and LDPC encoder 208 or the encoder is also comprised of zero padding unit 204, BCH encoder 206, LDPC encoder 208 and puncturing unit 210.

The zero padding unit 204 pads at least one bit having a value of '0' to information bits. By doing so, the zero padding unit 204 meets a length of an input bit stream of the BCH coder 206. For example, the zero padding unit 204 can additionally pad each of information bits after determining a position of at least one 0 bit. Also, the zero padding unit 204 can substitute the information bits for 0 bits of a position not a 0 bit in a 0 bit stream of the input bit stream length of the BCH coder 206 all composed of 0 bits. In detail, an information bits ($S=\{s_0, s_1, \ldots, s_{K_I-1}\}$) having a length of $K_I$ is input to the zero padding unit 204. And, the zero padding unit 204 receives information for zero-padding from the controller 202. The information for zero-padding is the bit positions to be padded with zero and/or the number of bits to be padded with zero. And the zero padding unit 204 pads the bits with zero using the information, thereby generating BCH information bits ($M=\{m_0, m_1, \ldots, m_{K_{bch}}\}$) having a length of $K_{bch}$. A process of determining the positions and/or number of the bits to be padded is described as follows.

By performing BCH coding for the BCH information bits ($M=\{m_0, m_1, \ldots, m_{K_{bch}}\}$), the BCH coder 206 generates ($K_{ldpc}-K_{bch}$) BCH parity bits, and generates a BCH codeword ($I_{ldpc}=\{i_0, i^1, \ldots, i_{K_{ldpc}}\}$). The BCH codeword ($I_{ldpc}=\{i_0, i_1, \ldots, i_{K_{ldpc}}\}$) is an LDPC information bits for LDPC coding, and is input to the LDPC coder 208. The BCH coding is a technology widely known in the art, and has been disclosed in documents such as "Bose, R. C.; Ray-Chaudhuri, D. K. (March 1960), "On A Class of Error Correcting Binary Group Codes", and Information and Control 3 (1): 68-79, ISSN 0890-5401". Thus, a detailed description thereof is omitted in the present invention.

By performing LDPC coding for the LDPC information bits ($I_{ldpc}=\{i_0, i_1, \ldots, i_{K_{ldpc}}\}$), the LDPC coder 208 generates an LDPC codeword ($C_{ldpc}=\{c_0, c_1, \ldots, c_{N_{ldpc}}\}$). That is, the LDPC coder 208 determines the LDPC codeword ($C_{ldpc}=\{c_0, c_1, \ldots, c_{N_{ldpc}}\}$) based on the parity-check matrix.

The puncturing unit 210 receives the LDPC codeword ($C_{ldpc}=\{c_0, c_1, \ldots, c_{N_{ldpc}}\}$) and punctures some bits in the LDPC codeword. The puncturing unit 210 can remove, together with the puncturing, padded bits by the zero padding unit 204. In this case, the puncturing unit 210 can be called a 'zero removing and puncturing unit'. When a function of removing the padded bits is excluded, the zero padding unit 204 is also omitted. That is, instead of padding bits and generating BCH information bits in the zero padding unit 204, the controller 202 can remove a column corresponding to the padded-bit in a parity-check matrix used in the LDPC coder 208. And then the above parity check matrix, of which some columns are removed, can be stored in memory. By removing the column corresponding to the padded-bit, the identical result is obtained despite the absence of a process of padding and removing.

The controller 202 provides the zero padding unit 204 with information for determining the positions and/or number of bits to be padded with zero, provides the BCH coder 206 with information related to the number and positions of BCH parity bits, provides the LDPC coder 208 with information such as a coding rate, a codeword length and a parity-check matrix, and provides the puncturing unit 210 with information for determining the number and/or positions of bits to be punctured. When the puncturing unit 210 has a zero elimination function, the controller 202 provides the puncturing unit 210 with the information for determining the positions and/or number of the bits to be padded with zero, identically with the provision to the zero padding unit 204. Also, when operations of the zero padding unit 204, the BCH coder 206, and the puncturing unit 210 are unnecessary, the controller 202 can control the zero padding unit 204, the BCH coder 206, and the puncturing unit 210 not to operate.

In the above construction, after padding by the zero padding unit 204, the bits padded with zero is not transmitted because the bits padded with zero is removed by the puncturing unit 210. Shortening generally comprises padding bits with zero before encoding and eliminating the zero-padded bits after encoding.

In an embodiment illustrated in FIG. 2, an output of the zero padding unit 204 is input to the BCH coder 206. However, according to another embodiment of the present invention, the BCH coder 206 is omitted. That is, the system may not use a BCH code and, in this case, the output of the zero padding unit 204 is directly input to the LDPC coder 208. According to an embodiment of the present invention, the BCH coder 206 and the zero padding unit 204 exchange positions. That is, an initial information bits before padding is input to the BCH coder 206, an output of the BCH coder 206 is provided to the zero padding unit 204, and an output of the zero padding unit 204 is provided to the LDPC coder 208.

The transmitter can previously store position information of bits to be shortened or punctured according to predefined index order or, after determining through operation according to a predefined rule, can select positions of bits to be shortened or punctured from an information bits or LDPC codeword based on the number of shortened or punctured bits. For description of convenience, in the present invention, order of shortened bits is called a 'shortening pattern', and order of punctured bits is called a 'puncturing pattern'. Shortening pattern or puncturing pattern also means order of shortened bit group or order of punctured parity bit group which is described later.

To apply shortening and puncturing to an input bit stream of a variable length, the present invention determines a shortening pattern and a puncturing pattern, and selects bits to be shortened/punctured according to the number of shortened/punctured bits and the shortening/puncturing pattern.

The following is an example of shortening and puncturing. Assuming that a length ($K_I$) of an information bits input to the zero padding unit 204 is equal to '5', a length ($K_{bch}$) of BCH information bits, which is an input bit stream of the BCH coder 206 is equal to '8', a length ($K_{ldpc}$) of LDPC information bits, which is an input bit stream of the LDPC coder 208 is equal to '10', and a length ($N_{ldpc}$) of LDPC codeword which is an output bit stream of the LDPC coder 208 is equal to '20', the number ($K_{bch}-K_I$) of shortened bits is equal to '3(=8−5)'. Assuming that the shortening pattern is defined as {7, 1, 4, 6, 2, 8, 3, 5, 0, 9}, the puncturing pattern is defined as {1, 4, 8, 6, 3, 0, 2, 5, 7, 9}, and the number of punctured bits is equal to '4', the shortening and puncturing are performed as follows.

For instance, if $S=\{s_0, s_1, s_2, s_3, s_4\}$ is input to the zero padding unit 204, a BCH information bits ($M=\{m_0, m_1, m_2, m_3, m_4, m_5, m_6, m_7\}$) is output from the zero padding unit 204. The number of shortened bits is equal to '3', so preceding three values within the shortening pattern are used, and are equal to '7', '1', and '4', so the shortening is performed in positions of $m_7$, $m_1$, $m_4$. In other words, bits in $m_7$, $m_1$, $m_4$ positions are padded with zero and the input bits ($S=\{s_0, s_1, s_2, s_3, s_4\}$) are successively mapped to positions in which the bits are not padded. That is, an output BCH information bits of the zero padding unit 204 is given as $M=\{m_0, m_1, m_2, m_3, m_4, m_5, m_6, m_7\}=\{s_0, 0, s_1, s_2, 0, s_3, s_4, 0\}$. The 'M' is input to the BCH coder 206, and a LDPC information bits, that is an input bit stream ($I_{ldpc}=\{i_0, i_1, i_2, i_3, i_4, i_5, i_6, i_7, i_8, i_9\}$) of the LDPC coder 208 is output from the BCH coder 206. The BCH code is a systematic code, and an intact BCH information bits exits in a codeword. Therefore, the LDPC information bits, that is the output bit stream ($I_{ldpc}$) of the BCH code is given as in Equation (4) as follows.

$$I_{ldpc} = \{i_0, i_1, i_2, i_3, i_4, i_5, i_6, i_7, i_8, i_9\} \quad (4)$$
$$= \{m_0, m_1, m_2, m_3, m_4, m_5, m_6, m_7, p_{bch,0}, p_{bch,1}\}$$
$$= \{s_0, 0, s_1, s_2, 0, s_3, s_4, 0, p_{bch,0}, p_{bch,1}\}$$

In Equation (4), '$I_{ldpc}$' denotes a BCH codeword that is the LDPC information bits, '$i_j$' denotes a $j^{th}$ bit of the LDPC information bits, '$m_j$' is a $j^{th}$ bit of a 0-padded bit stream and denotes a $j^{th}$ BCH information bit of the LDPC information bits, '$p_{bch,j}$' denotes a $j^{th}$ parity bit of the LDPC information bits, and '$s_j$' denotes a $j^{th}$ bit of an information bits.

An output bit stream ($C_{ldpc}$) of the LDPC coder 208 is given as in Equation (5) as follows.

$$C_{ldpc} = \{c_0, c_1, \ldots, c_{19}\} \quad (5)$$

$$= \{i_0, i_1, i_2, i_3, i_4, i_5, i_6, i_7, i_8, i_9,$$

$$p_0, p_1, p_2, p_3, p_4, p_5, p_6, p_8, p_9\}$$

$$= \{s_0, 0, s_1, s_2, 0, s_3, s_4, 0, p_{bch,0}, p_{bch,1},$$

$$p_0, p_1, p_2, p_3, p_4, p_5, p_6, p_7, p_8, p_9\}$$

In Equation (5), '$C_{ldpc}$' denotes an LDPC codeword, '$c_j$' denotes a $j^{th}$ bit of the LDPC codeword, '$i_j$' denotes a $j^{th}$ bit of a BCH codeword, that is the LDPC information bits, '$m_j$' is a $j^{th}$ bit of a 0-padded bit stream and denotes a $j^{th}$ BCH information bit of the LDPC information bits, '$s_j$' denotes a $j^{th}$ bit of an information bits, '$p_{bch,j}$' denotes a $j^{th}$ parity bit of the LDPC information bits, and '$p_j$' denotes a $j^{th}$ parity bit of the LDPC codeword.

The output bit stream ($C_{ldpc}$), that is LDPC codeword is input to the puncturing unit 210, bits padded by the zero padding unit 204 are removed, four parity bits are punctured according to a puncturing pattern. Preceding four values within the puncturing pattern are equal to '1', '4', '8', and '6', that means $p_1$, $p_4$, $p_8$ and $p_6$ are punctured. So, an output bit stream, that is an shortened and punctured codeword is given as in Equation (6) as follows.

$$\{s_0, s_1, s_2, s_3, s_4, p_{bch,0}, p_{bch,1}, p_0, p_2, p_3, p_5, p_7, p_9\} \quad (6)$$

In Equation (6), '$s_j$' denotes a $j^{th}$ bit of an information bits, '$p_{bch,j}$' denotes a $j^{th}$ parity bit of a BCH codeword, that is LDPC information bits, and '$p_j$' denotes a $j^{th}$ parity bit of an LDPC codeword.

As described above, when the transmitter performs the shortening and puncturing for an information bit stream (S) of a variable length, the transmitter determines a shortening pattern and a puncturing pattern, and determines positions of shortened and punctured bits in the shortening pattern and the puncturing pattern, using as many values as the number of the shortened and punctured bits.

Particularly, when performing LDPC coding based on the parity-check matrix having the structure of FIG. 1, order of shortened and punctured bits is determined in a unit of group of bits. That is, the present invention divides information bits and parity bits into a plurality of groups including bits of a pre-defined number, determines order of shortened and punctured groups, and then shortens and punctures as many bits as required number according to the shortening pattern and puncturing pattern determined in the unit of bit group.

In the above shortening and puncturing process, padding is performed for input bits of the BCH coder 206, order of the input bits of the BCH coder 206 are identical as order of input bits of the LDPC coder 208. Also, in the combined performance of an LDPC code and a BCH code, the performance of an LDPC codeword is more dominant, so order of shortening is determined based on a characteristic of the LDPC codeword. Particularly, the order of shortening is determined in a unit of bit group of information bits corresponding to the column group in the parity-check matrix, when the LDPC code is based on the parity-check matrix having the structure of FIG. 1.

FIGS. 3A to 3C illustrate relational formulas between a parity-check matrix and a codeword in a communication/broadcasting system according to an embodiment of the present invention.

FIG. 3A illustrates relationship between a parity-check matrix (H) and a codeword (c). As described above, a condition $H \cdot c^T = 0$ is met and, of the codeword ($c = [c_0, c_1, c_2, c_3, c_4, c_5, c_6, c_7]$), information bits are given as $c_0$, $c_1$, $c_2$, $c_3$ and parity bits are given as $c_4$, $c_5$, $c_6$, $c_7$.

FIG. 3B illustrates a different expression of the condition $H \cdot c^T = 0$. In FIG. 3B, a multiplication of the parity-check matrix (H) and the codeword (c) is expressed as the sum of multiplications of respective codeword bits and respective columns of the parity-check matrix. That is, '$H \cdot c^T = 0$' is a linear combination of the codeword bits and the columns of the parity-check matrix (H). That is, if a codeword bit ($c_i$) ($0 \le i \le 7$) is equal to '0', an $i^{th}$ column ($h_i$) of the parity-check matrix is multiplied by the '0'. This is identical to the $i^{th}$ column ($h_i$) not being linearly combined. In other words, when the codeword bit ($c_i$) is shortened, $c_i = 0$ is given. So, the identical result is obtained as the $i^{th}$ column ($h_i$) is deleted in the parity-check matrix. Therefore, determining whether to shorten which bits is equivalent to determining whether to delete which columns among the columns of the parity-check matrix. Also, in the present invention, the shortening process has been described above based on coding after padding the bits with zero and eliminating the padded bits among coded bits, which is identical to coding based on a parity-check matrix in which columns corresponding to bits to be padded with zero are removed in the parity-check matrix.

In the following shortening process, the present invention defines, as a shortening pattern, order of positions in which bits are padded with zero, codes after padding the bits with zero, and removes the zero-padded bits according to the shortening pattern in a codeword. However, according to another embodiment of the present invention, the shortening pattern is used to determine not the order of the positions in which the bits are padded but order of positions in which information bits are input. The shortening pattern represents order of positions in which bits are padded with zero. Thus, the order of the positions in which the information bits are mapped in the codeword can be acquired using shortening pattern.

Also, in the following puncturing process, the present invention defines, as a puncturing pattern, order of selecting bits punctured, and punctures the bits according to the puncturing pattern. However, according to another embodiment of the present invention, the puncturing pattern is used to determine not order of positions of bits to be punctured but order of bits not to be punctured. The puncturing pattern represents order of bits punctured. So, if reading the puncturing pattern in reverse order, it becomes order of bits not punctured. Accordingly, the puncturing process is performed by determining bits not punctured in the reverse order of the puncturing pattern and puncturing the remnant bits. Particularly, when the puncturing is performed for a fixed instead of a variable length, the bits not punctured is determined based on the puncturing pattern.

Referring also to FIG. 3C, a multiplication of the parity-check matrix (H) and the codeword (c) is expressed by each row. That is, four rows are expressed by four formulas 331 to 334. When only positions of shortened bits are known, a transmitter and a receiver know that '0' has been input. As for punctured bits, although the positions of the punctured bits are known, the transmitter and receiver cannot know if a corresponding bit has been equal to '0' or '1', so this information is processed as an unknown value, which affects a formula of a row including '1' in a position of a column having relation to a punctured bit. Accordingly, in determining the punctured bits, the characteristics of rows including '1' in a position of a column having relation to the punctured bit in the parity-check matrix should be considered.

Changing positions of columns of a parity-check matrix is the same as changing positions of codeword bits. Therefore, when the positions of the columns of the parity-check matrix are changed, if even positions of shortened information bits and positions of punctured parity bits are changed in the identical pattern, similar performance is guaranteed. In this case, a codeword set does not change. For example, as in FIG. 3B, assume that columns of a parity-check matrix are given as $h_0, h_1, h_2, h_3, h_4, h_5, h_6, h_7$, and positions of shortened bits are given as $c_0, c_3$. If the positions of the columns of the parity-check matrix are changed such as with $[h'_0, h'_1, h'_2, h'_3, h'_4, h'_5, h'_6, h'_7] = [h_2, h_1, h_4, h_5, h_7, h_6, h_3, h_0]$, a $0^{th}$ column of the parity-check matrix is changed into a $7^{th}$ column, and a $3^{rd}$ column of the parity-check matrix is changed into a $6^{th}$ column. Thus, if '$c'_7, c'_6$' are shortened, the same performance is guaranteed.

As described above, when an input information bits length ($K_I$) and an shortened and punctured codeword length are less than an information bits length ($K_{ldpc}$) and codeword length ($N_{ldpc}$) of an LDPC codeword, shortening and puncturing are applied. Punctured bits can be selected among all bits in codeword ($c_0$ to $c_{N_{ldpc}-1}$), or among parity bits in codeword. In the present invention, assuming a case of selecting the punctured bits among the parity bits, a description is made as follows. When the input information bits length ($K_I$) is variable, that is, when $K_I$ is greater than '1' and is less than '$K_{ldpc}$', order of shortening and puncturing for a variable length is required. That is, definition should be made about a shortening pattern for when one bit is shortened to when $K_{ldpc}-1$ bits are shortened, and a puncturing pattern for when one bit is punctured to when $N_{parity}-1$ bits are punctured.

In the present invention, a process of determining order of shortening and puncturing in a unit of bit group assuming the parity-check matrix having the structure of FIG. 1 is described as follows, and the order of shortening and puncturing is described in detail.

First, order of shortening for information bits is determined as follows.

All BCH information bits ($M = \{m_0, m_1, \ldots, m_{K_{bch}-1}\}$) are divided into $N_{group}$, each bit group is expressed as in Equation (7) as follows.

$$X_j = \left\{ m_k \mid j = \left\lfloor \frac{k}{(M/A_s)} \right\rfloor, 0 \leq k < K_{bch} \right\} \text{ for } 0 \leq j < N_{group} \quad (7)$$

In Equation (7) above, '$X_j$' denotes a $j^{th}$ bit group, '$m_k$' denotes a $k^{th}$ BCH information bit of a BCH information bits, 'M' denotes the number of columns included in one column group of a parity-check matrix of a form of FIG. 1, that is 'M' denotes the number of bits included in one bit group. '$A_s$' denotes a variable determining a size of a bit group, '$\lfloor x \rfloor$' denotes a maximum integer not exceeding 'x', '$K_{bch}$' denotes a length of the BCH information bits, and '$N_{group}$' denotes the number of bit groups.

$N_{group}$ is the same as $$\left\lceil \frac{K_{bch}}{M/A_s} \right\rceil \cdot \lceil x \rceil$$

denotes a minimum integer exceeding 'x'. '$A_s$' is any integer that is a divisor of 'M', and a variable determining a size of each bit group. That is, the size of each bit group is equal to ($M/A_s$). For example, a size of each bit group is 'M', when '$A_s$' is '1'. The performance of a system according to an embodiment of the present invention can vary depending on the size of the bit group. For instance, the performance improves when the size of each bit group is a divisor of the number of columns included in a column group of the parity-check matrix. Accordingly, '$A_s$' is selected as a value suitable to the performance of the system.

Figure 4A:
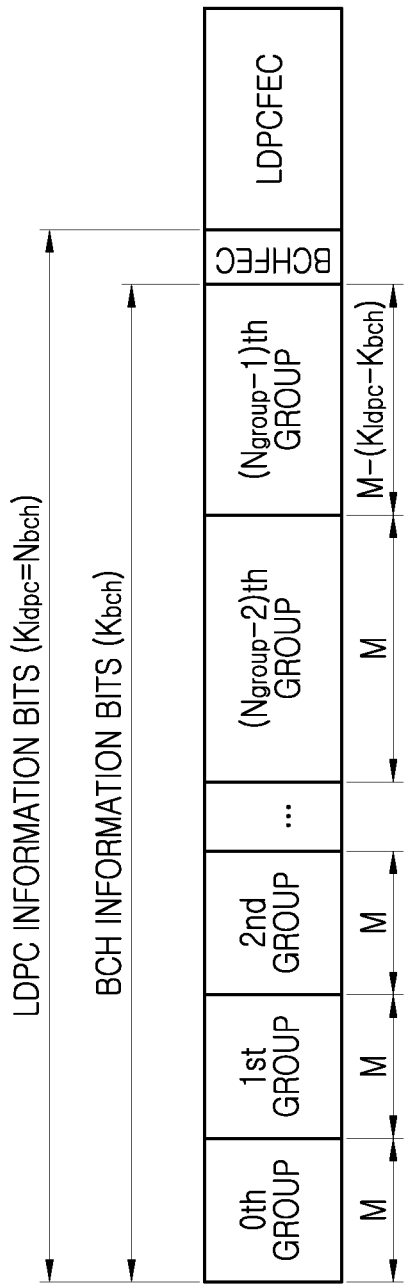
FIGS. 4A and 4B illustrate grouping of information bits in a communication/broadcasting system according to an embodiment of the present invention.
Figure 4B:
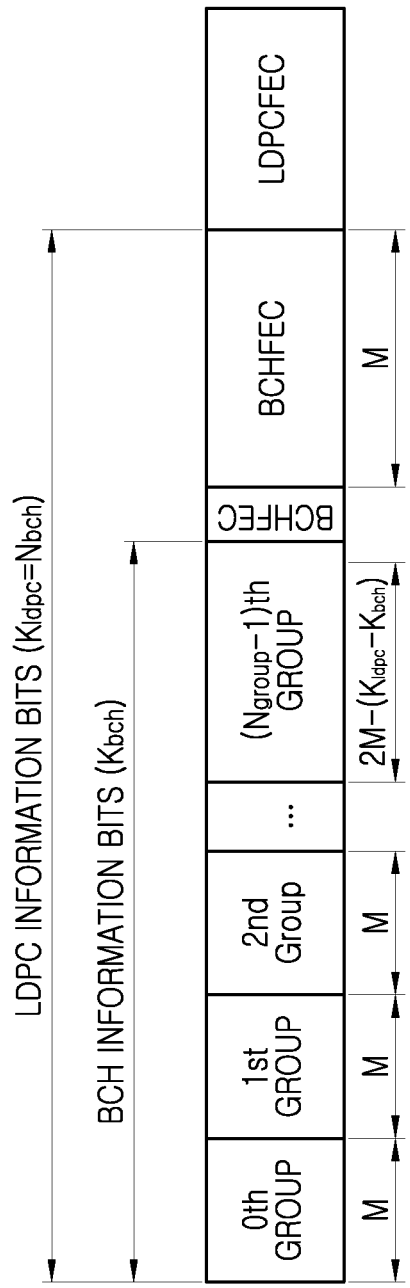

Regarding the bit groups constructed as in Equation (7) above, FIGS. 4A and 4B illustrate bit groups of information bits. Referring to FIGS. 4A and 4B, '$A_s$' is '1' and each bit group includes 'M' bits, and the last bit group includes $a \times M - (K_{ldpc} - K_{bch})$ bits, where 'a' denotes the number of groups including the parity bits of the BCH code (BCHFEC). In FIG. 4A, 'a' is equal to '1', and in FIG. 4B, 'a' is equal to '2'. In a system not using the BCH code, it is obvious that '$K_{bch}$' and '$K_{ldpc}$' are identical to each other.

The present invention defines a shortening pattern in an unit of bit group. As described above, BCH information bits are identical to the remnant bits excepting BCH parity bits among LDPC information bits, so the present invention determines order of shortening in consideration of LDPC information bits, and based on a given parity-check matrix. A process of determining the order of shortening based on the given parity-check matrix is described as follows.

In the parity-check matrix of the structure of FIG. 1, the information word part matrix 110 is divided into column groups composed of 'M' continuous columns. Accordingly, LDPC information bits corresponding to columns within a column group having 'M' columns compose bit groups of Equation 7 above, having 'M' bits. That is, $0^{th}$ bit group of FIG. 4A have correspondence with $0^{th}$ column group of FIG. 1. And, $0^{th}$ bit group comprises at least one bit and each bit in $0^{th}$ bit group of FIG. 4A have correspondence with each column in $0^{th}$ column group of FIG. 1. Also, $i^{th}$ bit group of FIG. 4A includes bits which have correspondence with columns in $i^{th}$ column group of FIG. 1. Accordingly, a shortening pattern is determined by determining, in a unit of column groups, order of column groups to be deleted in the parity-check matrix. In other words, converting order of deletion of a column group into order of bit groups corresponding to each column group is the shortening pattern.

The shortening pattern represents order of shortened bits or order of shortened bit groups. If shortening pattern is determined in an order of bit groups, order of shortened bits within each shortened bit group can be defined variously. Determining the order of shortening in the unit of group can obtain similar performance as determining the order of shortening in the unit of bit, because bits belonging to the same group have similar degrees and cycle performance.

FIGS. 5A and 5B illustrate grouping of parity bits in a communication/broadcasting system according to an embodiment of the present invention.

As illustrated in FIG. 5A, all LDPC parity bits ($[p_0, p_1, \ldots, p_{N_{ldpc}-K_{ldpc}-1}]$) are divided into $Q_{ldpc} \cdot A_p$ groups composed of $(M/A_p)$ bits. Here, the '$Q_{ldpc}$' is the identical as a value dividing the number ($N_{parity} = N_{ldpc} - K_{ldpc}$) of parity bits by '$(M/A_p)$', and the '$A_p$' is a variable determining a size of a parity bit group. Each parity bit group is defined as in Equation (8) as follows.

$$P_j = \{p_k \mid k \bmod (Q_{ldpc} \cdot A_p) = j, 0 \leq k < N_{ldpc} - K_{ldpc}\} \text{ for } 0 \leq j < (Q_{ldpc} \cdot A_p) \quad (8)$$

In Equation (8), '$P_j$' denotes a $j^{th}$ parity bit group, '$p_k$' denotes a $k^{th}$ parity bit, '$Q_{ldpc}$' denotes the basic number of parity bit groups, '$A_p$' denotes a variable determining a size of a parity bit group, '$N_{ldpc}$' denotes a length of an LDPC codeword, and '$K_{ldpc}$' denotes a length of LDPC information bits. '$A_p$' is any integer that is a divisor of 'M', and determines a size of each parity bit group and the number. That is, the size of each parity bit group is equal to $(M/A_p)$, and the number of parity bit groups is equal to $Q_{ldpc} \cdot A_p$. For example, a size of parity bit group is 'M' when '$A_p$' is '1'.

As illustrated in FIG. 5B, if order of parity bits are converted according to Equation 9, parity bit groups defined in Equation 10 are given. Equation (9), as follows, causes an interleaving effect of the parity bits.

$$d_{M \cdot t+s} = p_{Q_{ldpc} \cdot s+t} \text{ for } 0 \le s < M, \, 0 \le t < Q_{ldpc} \quad (9)$$

In Equation (9), '$d_j$' denotes a $j^{th}$ parity bit after conversion, '$p_j$' denotes a $j^{th}$ parity bit before the conversion, and '$Q_{ldpc} \cdot A_p$' denotes the number of parity bit groups.

$$P_j = \left\{ d_j \mid j = \left\lfloor \frac{k}{(M/A_p)} \right\rfloor, 0 \le k < N_{ldpc} - K_{ldpc} \right\} \text{ for } 0 \le j < (M/A_p) \quad (10)$$

In Equation (10), '$P_j$' denotes a $j^{th}$ parity bit group before conversion, '$d_j$' denotes a $j^{ij}$ parity bit after the conversion, 'M' denotes the number of columns included in one column group of the parity-check matrix of the form of FIG. 1, '$A_p$' denotes a variable determining a size of a parity bit group, '$N_{ldpc}$' denotes a length of an LDPC codeword, and '$K_{ldpc}$' denotes a length of LDPC information bits. '$A_p$' is any integer that is a divisor of 'M', and determines a size of each parity bit group and the number. That is, the size of each parity bit group is equal to $(M/A_p)$, and the number of parity bit groups is equal to $Q_{ldpc} \cdot A_p$. For example, '$A_p$' is '1'.

Parity bits constituting the $j^{th}$ parity bit group ($P_j$) shown in Equations 9 and 10 are identical to each other. In other words, the parity bits constituting each parity group do not change. However, if positions of the parity bits are converted according to Equation (9), continuous bits are constructed as one group based on the parity bits ($d_j$) after the conversion. This enhances processing convenience. Puncturing parity bits in a unit of parity bit group can be realized with or without conversion process corresponding to Equation (9) and (10) and FIGS. 5A and 5B.

Since bits within the same group have the same degree and the same cycle characteristic, determining a puncturing pattern in a unit of group guarantees similar performance as finding an optimal puncturing pattern in a bit unit. Therefore, the present invention determines the puncturing pattern in a unit of parity bit group.

The following applies when shortening $N_{short}$ bits and puncturing $N_{punc}$ bits for a code of a given $N_{ldpc}$, $K_{ldpc}$ length, determining a shortening pattern and puncturing pattern that are in the order of optimal shortened bits and punctured bits as above.

When using a combination of a BCH code and an LDPC code, it is desirable not to shorten parity bits of the BCH. Therefore, the group including the parity bits of the BCH code is shortened last and, in the group including the parity bits of the BCH code, the number of shortened bits is determined to be $a \times M - (K_{ldpc} - K_{bch})$ where 'a' is the number of groups including the BCH parity bits. If the number of the parity bits of the BCH code is greater than the number (M) of bits of the bit group, two or more groups can have the latest order of shortening. In FIG. 4, the parity bits of the BCH code are included in the last group. Positions of the parity bits of the BCH code can vary according to a coding rate and a size of a code.

A shortening pattern and puncturing pattern according to an embodiment of the present invention is determined based on the following rules.

[Rule 1] For a code of a given $N_{ldpc}$, $K_{ldpc}$ length, when the number of information bits is fixed and when it is variable, a different shortening pattern and puncturing pattern are defined. When the number of information bits is fixed, it is sufficient to determine an optimal shortening pattern and puncturing pattern only for one length. However, when the number of information bits is variable, an optimal shortening pattern and puncturing pattern is required for a plurality of lengths.

[Rule 2] A shortening pattern and puncturing pattern varying according to a modulation scheme are defined.

[Rule 3] Other shortening patterns and puncturing patterns varying according to a shortening and puncturing rate are defined. For example, a relational formula between the number of shortened bits and the number of punctured bits is applied as in Equation (11) as follows. In this case, the shortening and puncturing rate is determined according to values of constants 'A' and 13'.

$$N_{punc} = \lfloor A \cdot N_{short} - B \rfloor \quad (11)$$

In Equation (11), '$N_{punc}$' denotes the number of punctured bits, '$N_{short}$' denotes the number of shortened bits, and 'A' and 'B' denote constants determining the shortening and puncturing rate. 'A', which is a constant greater than '0', denotes the puncturing and shortening rate. In other words, the value of 'A' is related to coding rate. 'B' is a value of a positive number, a negative number, or '0', and denotes a correction factor. It is obvious that a value of the number ($N_{punc}$) of actually punctured bits is also corrected in consideration of a modulation scheme, a transmission scheme and the like used in the $N_{punc}$ value obtained based on Equation 11. For example, to make the number of actually transmitted codeword bits be a multiple of bits according to a modulation scheme, it is possible to correct '$N_{punc}$' obtained based on Equation 11.

According to Equation (11), the number ($N_{punc}$) of punctured bits corresponding to the given number ($N_{short}$) of shortened bits is determined according to the 'A' and 'B' values. Accordingly, other puncturing patterns or shortening patterns are defined according to the 'A' and 'B' values.

A process of determining a shortening pattern and a puncturing pattern according to the present invention is described as follows in detail.

[Step 1] The present invention distinguishes LDPC codeword bits into bit groups including bits of $(M/A_s)$ number and parity bit groups including $(M/A_p)$ bits.

[Step 2] The present invention determines a shortened bit group among the plurality of bit groups. The shortened bit group has correspondence with column group deleted in a parity-check matrix. Optimal coding performance is maintained when the proper column group is deleted.

[Step 3] The present invention determines the number of punctured parity bits according to Equation (11) based on the number of shortened bits or shortened bit groups, and selects parity bit groups to be punctured as many as the number of parity bit groups corresponding to the number of punctured bits. That is, when bit groups of 'Z' number are shortened, it means that bits of $Z \times (M/A_s)$ number are shortened, so $$Y = \left\lfloor \frac{Z \cdot (M/A_s) - B}{(M/A_p)} \right\rfloor$$

parity bit groups should be punctured. Accordingly, the present invention defines a puncturing pattern to select parity bit group corresponding to 'Y' column groups of parity part in parity check matrix that, despite puncturing, will ensure excellent performance in a parity-check matrix, and puncture parity bit groups corresponding to the selected column groups of parity in parity check matrix. Where column groups of parity part in parity check matrix means columns of parity part corresponding with bits in parity bit groups. To make a row degree of the parity-check matrix constant, 'Y' column groups are selected.

[Step 4] The present invention repeats Steps 2 and 3 above until all bit groups are selected.

Examples of the shortening pattern and puncturing pattern defined for a plurality of parity check matrices of the structure of FIG. 1 according to the present invention are described as follows, using $A_s=1$, $A_p=1$.

Regarding a LDPC codeword length ($N_{ldpc}$) and a coding rate (R), length of LDPC information bits ($K_{ldpc}$), M number of bit group ($N_{group}$), and number of parity bit group ($N_{parity\_group}$) are determined as in Table 2 as follows. The number of bit group ($N_{group}$) can vary according to the number of BCH parity bits. Here, M denotes the number of columns included in one column group of a parity check matrix of a form of FIG. 1, that is 'M' denotes the number of bits included in one bit group and parity bit group when $A_s=1$ and $A_p=1$.

TABLE 2

| $N_{ldpc}$ | R | $K_{ldpc}$ | M | $N_{group}$ | $N_{parity\_group}$ ($=Q_{ldpc}$) | Parity-check matrix |
|---|---|---|---|---|---|---|
| 16200 | 1/3 | 5400 | 360 | 15 | 30 | Table 3 |
| 16200 | 1/5 | 3240 | 360 | 9 | 36 | Table 4 |
| 4320 | 2/3 | 2880 | 72 | 40 | 20 | Table 5 |
| 4320 | 1/2 | 2160 | 72 | 30 | 30 | Table 6 |
| 4320 | 1/3 | 1440 | 72 | 20 | 40 | Table 7 |
| 4320 | 1/4 | 1080 | 72 | 15 | 45 | Table 8 or Table 44 |
| 4320 | 1/5 | 864 | 72 | 12 | 48 | Table 9 or Table 45 |

When the LDPC codeword length ($N_{ldpc}$) is equal to '16200', the coding rate (R) is equal to '1/3', and 'M' is equal to '360', a parity-check matrix is given as in Table 3 as follows. In expressing the parity-check matrix, a column group index is generally excluded as in Table 3 as follows.

TABLE 3

Index of row in which 1 is positioned in
i   $0^{th}$ column of $i^{th}$ column group 1  416 8909 4156 3216 3112 2560 2912 6405 8593 4969 6723 6912
2  8978 3011 4339 9312 6396 3957 7288 5485 6031 10218 2226 3575
3  3383 10059 1114 10008 10147 9384 4290 434 5139 3536 1965 2291
4  2797 3693 7615 7077 743 1941 8716 6215 3840 5140 4582 5420
5  6110 8551 1515 7404 4879 4946 5383 1831 3441 9569 10472 4305
6  1505 5682 7778
7  7172 6830 6626
8  7281 3941 3505
9  10270 8669 914
10 3622 7563 9388
11 9930 5058 4554
12 4844 9609 2707
13 6883 3237 1714
14 4768 3878 10017
15 10127 3334 8267

When the LDPC codeword length ($N_{ldpc}$) is equal to '16200', the coding rate (R) is equal to '1/5', and 'M' is equal to '360', a parity-check matrix is given as in Table 4 as follows.

TABLE 4

Index of row in which 1 is positioned in
i   $0^{th}$ column of $i^{th}$ column group 1  6295 9626 304 7695 4839 4936 1660 144 11203 5567 6347 12557
2  10691 4988 3859 3734 3071 3494 7687 10313 5964 8069 8296 11090
3  10774 3613 5208 11171 7676 3549 8746 6583 7239 12265 2674 4292
4  11869 3708 5981 8718 4908 10650 6805 3334 2627 10461 9285 11120
5  7844 3079 10773
6  3385 10854 5747
7  1360 12010 12202
8  6189 4241 2343
9  9840 12726 4977

When the LDPC codeword length ($N_{ldpc}$) is equal to '4320', the coding rate (R) is equal to '2/3', and 'M' is equal to '72', a parity-check matrix is given as in Table 5 as follows.

TABLE 5

Index of row in which 1 is positioned in
i   $0^{th}$ column of $i^{th}$ column group 0  56 291 315 374 378 665 682 713 740 884 923 927 1193 1203 1293 1372 1419 1428
1  1 17 113 402 406 504 559 597 686 697 817 878 983 1007 1034 1142 1231 1431
2  2 205 350 428 538 605 866 973 1008 1182 1252 1303 1319 1337 1346 1387 1417 1422
3  50 158 244 424 455 597 830 889 900 945 978 1040 1052 1059 1101 1150 1254 1382
4  41 53 269 316 449 604 704 752 937 952 1021 1031 1044 1068 1104 1265 1327 1348
5  601 911 1020 1260
6  151 674 732 1240
7  1099 1250 1348 1366
8  1115 1124 1394 1414
9  66 250 875 1040
10 525 603 916 1402
11 529 561 913 1089
12 1110 1243 1280 1372
13 137 656 1316 1369
14 5 458 1043 1381
15 1122 1171 1187 1335
16 18 130 312 1209
17 30 534 705 1294
18 272 727 955 1192
19 925 1287 1385 1437
20 11 446 1281 1408
21 614 716 787 1340
22 615 1147 1411 1416
23 284 865 1151 1414
24 202 689 1088 1144
25 459 633 838 941
26 46 301 1229 1367
27 476 1031 1120 1418
28 138 336 560 1419
29 168 357 536 938
30 1001 1052 1162 1414
31 349 1039 1353 1426
32 146 203 530 549
33 510 545 979 1108
34 479 1069 1106 1244
35 743 1019 1275 1348
36 427 721 1023 1435
37 73 842 1296 1435
38 323 1106 1140 1428
39 1074 1235 1353 1391

When the LDPC codeword length ($N_{ldpc}$) is equal to '4320', the coding rate (R) is equal to '1/2', and 'M' is equal to '72', a parity-check matrix is given as in Table 6 as follows.

TABLE 6

| i | Index of row in which 1 is positioned in 0th column of $i^{th}$ column group |
|---|---|
| 0 | 142 150 213 247 507 538 578 828 969 1042 1107 1315 1509 1584 1612 1781 1934 2106 2117 |
| 1 | 3 17 20 31 97 466 571 580 842 983 1152 1226 1261 1392 1413 1465 1480 2047 2125 |
| 2 | 49 169 258 548 582 839 873 881 931 995 1145 1209 1639 1654 1776 1826 1865 1906 1956 |
| 3 | 148 393 396 486 568 806 909 965 1203 1256 1306 1371 1402 1534 1664 1736 1844 1947 2055 |
| 4 | 185 191 263 290 384 769 981 1071 1202 1357 1554 1723 1769 1815 1842 1880 1910 1926 1991 |
| 5 | 424 444 923 1679 |
| 6 | 91 436 535 978 |
| 7 | 362 677 821 1695 |
| 8 | 1117 1392 1454 2030 |
| 9 | 35 840 1477 2152 |
| 10 | 1061 1202 1836 1879 |
| 11 | 242 286 1140 1538 |
| 12 | 111 240 481 760 |
| 13 | 59 1268 1899 2144 |
| 14 | 737 1299 1395 2072 |
| 15 | 34 288 810 1903 |
| 16 | 232 1013 1365 1729 |
| 17 | 410 783 1066 1187 |
| 18 | 113 885 1423 1560 |
| 19 | 760 909 1475 2048 |
| 20 | 68 254 420 1867 |
| 21 | 283 325 334 970 |
| 22 | 168 321 479 554 |
| 23 | 378 836 1913 1928 |
| 24 | 101 238 964 1393 |
| 25 | 304 460 1497 1588 |
| 26 | 151 192 1075 1614 |
| 27 | 297 313 677 1303 |
| 28 | 329 447 1348 1832 |
| 29 | 582 831 984 1900 |

When the LDPC codeword length ($N_{ldpc}$) is equal to '4320', the coding rate (R) is equal to '1/3', and 'M' is equal to '72', a parity-check matrix is given as in Table 7 as follows.

TABLE 7

| i | Index of row in which 1 is positioned in $0^{th}$ column of $i^{th}$ column group |
|---|---|
| 0 | 22 451 529 665 1424 1566 1843 1897 1940 2069 2334 2760 2833 |
| 1 | 287 303 321 644 874 1110 1132 1175 1266 1377 1610 1819 2517 |
| 2 | 58 183 247 821 965 1315 1558 1802 1969 2013 2095 2271 2627 |
| 3 | 181 285 1171 1208 1239 1468 1956 1992 2083 2253 2456 2664 2859 |
| 4 | 209 1067 1240 2698 |
| 5 | 970 1201 2099 2388 |
| 6 | 211 1820 2602 2630 |
| 7 | 471 1101 1972 2244 |
| 8 | 254 793 2546 2680 |
| 9 | 147 761 1495 2794 |
| 10 | 75 1108 2256 2842 |
| 11 | 178 796 1309 1763 |
| 12 | 1820 2157 2470 2686 |
| 13 | 998 1502 1728 2431 |
| 14 | 1385 1432 1919 2730 |
| 15 | 244 972 1673 1902 |

TABLE 7-continued

| i | Index of row in which 1 is positioned in $0^{th}$ column of $i^{th}$ column group |
|---|---|
| 16 | 583 1333 1645 2675 |
| 17 | 316 664 1086 2854 |
| 18 | 776 997 2287 2825 |
| 19 | 537 1719 1746 2728 |

When the LDPC codeword length ($N_{ldpc}$) is equal to '4320', the coding rate (R) is equal to '1/4', and 'M' is equal to '72', a parity-check matrix is given as in Table 8 as follows.

TABLE 8

| i | Index of row in which 1 is positioned in $0^{th}$ column of column group |
|---|---|
| 0 | 1343 1563 2745 3039 |
| 1 | 1020 1147 1792 2609 |
| 2 | 2273 2320 2774 2976 |
| 3 | 665 2539 2669 3010 |
| 4 | 581 1178 1922 2998 |
| 5 | 633 2559 2869 2907 |
| 6 | 876 1213 2191 2261 |
| 7 | 916 1217 1632 2798 |
| 8 | 500 992 1230 2630 |
| 9 | 1842 2038 2169 2312 |
| 10 | 595 679 1206 1486 |
| 11 | 1087 2981 2894 3123 |
| 12 | 73 185 355 1381 1672 1998 2406 2577 2600 2834 3084 3115 3150 |
| 13 | 22 65 390 1022 1046 1465 1498 1682 1879 2108 2164 2203 3106 |
| 14 | 127 213 714 816 1031 1456 1815 2097 2183 2404 2934 2999 3153 |

When the LDPC codeword length ($N_{ldpc}$) is equal to '4320', the coding rate (R) is equal to '1/5', and 'M' is equal to '72', a parity-check matrix is given as in Table 9 as follows.

TABLE 9

| i | Index of row in which 1 is positioned in $0^{th}$ column of column group |
|---|---|
| 0 | 384 944 1269 2266 |
| 1 | 407 1907 2268 2594 |
| 2 | 1047 1176 1742 1779 |
| 3 | 304 890 1817 2645 |
| 4 | 102 316 353 2250 |
| 5 | 488 811 1662 2323 |
| 6 | 31 2397 2468 3321 |
| 7 | 102 514 828 1010 1024 1663 1737 1870 2154 2390 2523 2759 3380 |
| 8 | 216 383 679 938 970 975 1668 2212 2300 2381 2413 2754 2997 |
| 9 | 536 889 993 1395 1603 1691 2078 2344 2545 2741 3157 3334 3377 |
| 10 | 694 1115 1167 2548 |
| 11 | 1266 1993 3229 3415 |

When a Binary Phase Shift Keying (BPSK) or Quadrature Phase Shift Keying (QPSK) modulation scheme is used based on the parity-check matrix for which '$N_{ldpc}$' is equal to '16200' and 'R' is equal to '1/3' as in Table 3 above, and 'A=5/3' and 'B=0' of Equation 11 above are given, a shortening pattern is defined as in Table 10 as follows, and a puncturing pattern is defined as in Table 11 as follows.

TABLE 10

| Order of information bits group to be shortened | | | | | | | |
|---|---|---|---|---|---|---|---|
| 16200, 1/3 | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ |
| BPSK/QPSK | $\pi_s(8)$ | $\pi_s(9)$ | $\pi_s(10)$ | $\pi_s(11)$ | $\pi_s(12)$ | $\pi_s(13)$ | $\pi_s(14)$ | |
| | 13 | 12 | 11 | 10 | 4 | 9 | 8 | 3 |
| | 7 | 6 | 2 | 5 | 1 | 14 | 0 | |

The '$\pi_s(x)$' denotes an index of an $x^{th}$-shortened bit group. That is, an index ($\pi_s(0)$) of a $0^{th}$-shortened bit group is equal to '13', and a $13^{th}$ bit group ($X_{13}$) is first shortened at the 0th bit group.

TABLE 11

| | Order of parity bits group to be punctured | | | | | | |
|---|---|---|---|---|---|---|---|
| 16200, 1/3 BPSK/QPSK | $\pi_P(0)$ | $\pi_P(1)$ | $\pi_P(2)$ | $\pi_P(3)$ | $\pi_P(4)$ | $\pi_P(5)$ | $\pi_P(6)$ | $\pi_P(7)$ |
| | $\pi_P(8)$ | $\pi_P(9)$ | $\pi_P(10)$ | $\pi_P(11)$ | $\pi_P(12)$ | $\pi_P(13)$ | $\pi_P(14)$ | $\pi_P(15)$ |
| | $\pi_P(16)$ | $\pi_P(17)$ | $\pi_P(18)$ | $\pi_P(19)$ | $\pi_P(20)$ | $\pi_P(21)$ | $\pi_P(22)$ | $\pi_P(23)$ |
| | $\pi_P(24)$ | $\pi_P(25)$ | $\pi_P(26)$ | $\pi_P(27)$ | $\pi_P(28)$ | $\pi_P(29)$ | | |
| | 27 | 7 | 3 | 13 | 17 | 9 | 1 | 20 |
| | 24 | 29 | 26 | 21 | 15 | 22 | 4 | 0 |
| | 23 | 10 | 14 | 8 | 18 | 6 | 25 | 11 |
| | 2 | 19 | 12 | 28 | 5 | 16 | | |

The '$\pi_p(x)$' denotes an index of an $x^{th}$-punctured parity bit group. That is, an index ($\pi_p(0)$) of a $0^{th}$-punctured parity bit group is equal to '27', and a $27^{th}$ parity bit group ($P_{27}$) is first punctured.

When a BPSK or QPSK modulation scheme is used based on the parity-check matrix for which '$N_{ldpc}$' is equal to '16200' and 'R' is equal to '⅓' as in Table 3 above, and 'A=7/4' and 'B=0' of Equation 11 above are given, a shortening pattern is defined as in Table 12 as follows, and a puncturing pattern is defined as in Table 13 as follows.

TABLE 12

| | Order of information bits group to be shortened | | | | | | |
|---|---|---|---|---|---|---|---|
| 16200, 1/3 BPSK/QPSK | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ |
| | $\pi_s(8)$ | $\pi_s(9)$ | $\pi_s(10)$ | $\pi_s(11)$ | $\pi_s(12)$ | $\pi_s(13)$ | $\pi_s(14)$ | |
| | 13 | 12 | 11 | 10 | 4 | 9 | 3 | 2 |
| | 8 | 7 | 6 | 1 | 5 | 14 | 0 | |

The '$\pi_s(x)$' denotes an index of an $x^{th}$-shortened bit group. That is, an index ($\pi_s(0)$) of a $0^{th}$-shortened bit group is equal to '13', and a $13^{th}$ bit group ($X_{13}$) is first shortened.

TABLE 13

| | Order of parity bits group to be punctured | | | | | | |
|---|---|---|---|---|---|---|---|
| 16200, 1/3 BPSK/QPSK | $\pi_P(0)$ | $\pi_P(1)$ | $\pi_P(2)$ | $\pi_P(3)$ | $\pi_P(4)$ | $\pi_P(5)$ | $\pi_P(6)$ | $\pi_P(7)$ |
| | $\pi_P(8)$ | $\pi_P(9)$ | $\pi_P(10)$ | $\pi_P(11)$ | $\pi_P(12)$ | $\pi_P(13)$ | $\pi_P(14)$ | $\pi_P(15)$ |
| | $\pi_P(16)$ | $\pi_P(17)$ | $\pi_P(18)$ | $\pi_P(19)$ | $\pi_P(20)$ | $\pi_P(21)$ | $\pi_P(22)$ | $\pi_P(23)$ |
| | $\pi_P(24)$ | $\pi_P(25)$ | $\pi_P(26)$ | $\pi_P(27)$ | $\pi_P(28)$ | $\pi_P(29)$ | | |
| | 27 | 7 | 3 | 13 | 17 | 9 | 24 | 1 |
| | 20 | 29 | 21 | 26 | 23 | 15 | 10 | 4 |
| | 22 | 28 | 14 | 8 | 18 | 6 | 2 | 19 |
| | 11 | 0 | 16 | 5 | 25 | 12 | | |

The '$\pi_p(x)$' denotes an index of an $x^{th}$-punctured parity bit group. That is, an index ($\pi_p(0)$) of a $0^{th}$-punctured parity bit group is equal to '27', and a $27^{th}$ parity bit group ($P_{27}$) is first punctured.

When a BPSK or QPSK modulation scheme is used based on the parity-check matrix for which '$N_{ldpc}$' is equal to '16200' and 'R' is equal to '⅓' as in Table 3 above, and 'A=9/5' and 'B=0' of Equation 11 above are given, a shortening pattern is defined as in Table 14 as follows, and a puncturing pattern is defined as in Table 15 as follows.

TABLE 14

| | Order of information bits group to be shortened | | | | | | |
|---|---|---|---|---|---|---|---|
| 16200, 1/3 BPSK/QPSK | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ |
| | $\pi_s(8)$ | $\pi_s(9)$ | $\pi_s(10)$ | $\pi_s(11)$ | $\pi_s(12)$ | $\pi_s(13)$ | $\pi_s(14)$ | |
| | 13 | 12 | 11 | 10 | 4 | 9 | 3 | 8 |
| | 7 | 2 | 6 | 5 | 1 | 14 | 0 | |

The '$\pi_s(x)$' denotes an index of an $x^{th}$-shortened bit group. That is, an index ($\pi_s(0)$) of a $0^{th}$-shortened bit group is equal to '13', and a $13^{th}$ bit group ($X_{13}$) is first shortened.

TABLE 15

| Order of parity bits group to be punctured | | | | | | | | |
|---|---|---|---|---|---|---|---|---|
| 16200, 1/3 BPSK/QPSK | $\pi_P(0)$ | $\pi_P(1)$ | $\pi_P(2)$ | $\pi_P(3)$ | $\pi_P(4)$ | $\pi_P(5)$ | $\pi_P(6)$ | $\pi_P(7)$ |
| | $\pi_P(8)$ | $\pi_P(9)$ | $\pi_P(10)$ | $\pi_P(11)$ | $\pi_P(12)$ | $\pi_P(13)$ | $\pi_P(14)$ | $\pi_P(15)$ |
| | $\pi_P(16)$ | $\pi_P(17)$ | $\pi_P(18)$ | $\pi_P(19)$ | $\pi_P(20)$ | $\pi_P(21)$ | $\pi_P(22)$ | $\pi_P(23)$ |
| | $\pi_P(24)$ | $\pi_P(25)$ | $\pi_P(26)$ | $\pi_P(27)$ | $\pi_P(28)$ | $\pi_P(29)$ | | |
| | 27 | 7 | 3 | 13 | 17 | 9 | 24 | 1 |
| | 20 | 29 | 21 | 26 | 15 | 22 | 4 | 0 |
| | 10 | 23 | 14 | 8 | 19 | 11 | 18 | 5 |
| | 28 | 6 | 16 | 2 | 12 | 25 | | |

The '$\pi_p(x)$' denotes an index of an $x^{th}$-punctured parity bit group. That is, an index ($\pi_p(0)$) of a $0^{th}$-punctured parity bit group is equal to '27', and a $27^{th}$ parity bit group ($P_{27}$) is first punctured.

When a 16 Quadrature Amplitude Modulation (16QAM) modulation scheme is used based on the parity-check matrix for which '$N_{ldpc}$' is equal to '16200' and 'R' is equal to '1;3' as in Table 3 above, and 'A=5/3' and 'B=0' of Equation (11) above are given, a shortening pattern is defined as in Table 16 as follows, and a puncturing pattern is defined as in Table 17 as follows.

TABLE 16

| Order of information bits group to be shortened | | | | | | | | |
|---|---|---|---|---|---|---|---|---|
| 16200, 1/3 16 QAM | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ |
| | $\pi_s(8)$ | $\pi_s(9)$ | $\pi_s(10)$ | $\pi_s(11)$ | $\pi_s(12)$ | $\pi_s(13)$ | $\pi_s(14)$ | |
| | 13 | 4 | 12 | 11 | 3 | 10 | 9 | 8 |
| | 2 | 7 | 6 | 1 | 5 | 14 | 0 | |

TABLE 17

| Order of parity bits group to be punctured | | | | | | | | |
|---|---|---|---|---|---|---|---|---|
| 16200, 1/3 16 QAM | $\pi_P(0)$ | $\pi_P(1)$ | $\pi_P(2)$ | $\pi_P(3)$ | $\pi_P(4)$ | $\pi_P(5)$ | $\pi_P(6)$ | $\pi_P(7)$ |
| | $\pi_P(8)$ | $\pi_P(9)$ | $\pi_P(10)$ | $\pi_P(11)$ | $\pi_P(12)$ | $\pi_P(13)$ | $\pi_P(14)$ | $\pi_P(15)$ |
| | $\pi_P(16)$ | $\pi_P(17)$ | $\pi_P(18)$ | $\pi_P(19)$ | $\pi_P(20)$ | $\pi_P(21)$ | $\pi_P(22)$ | $\pi_P(23)$ |
| | $\pi_P(24)$ | $\pi_P(25)$ | $\pi_P(26)$ | $\pi_P(27)$ | $\pi_P(28)$ | $\pi_P(29)$ | | |
| | 27 | 7 | 1 | 19 | 12 | 15 | 26 | 21 |
| | 9 | 23 | 29 | 3 | 14 | 18 | 28 | 10 |
| | 24 | 22 | 4 | 20 | 8 | 6 | 17 | 2 |
| | 13 | 5 | 25 | 11 | 16 | 0 | | |

When a 16QAM modulation scheme is used based on the parity-check matrix for which '$N_{ldpc}$' is equal to '16200' and 'R' is equal to '⅓' as in Table 3 above, and 'A=7/4' and 'B=0' of Equation (11) above are given, a shortening pattern is defined as in Table 18 as follows, and a puncturing pattern is defined as in Table 19 as follows.

TABLE 18

| Order of information bits group to be shortened | | | | | | | | |
|---|---|---|---|---|---|---|---|---|
| 16200, 1/3 16 QAM | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ |
| | $\pi_s(8)$ | $\pi_s(9)$ | $\pi_s(10)$ | $\pi_s(11)$ | $\pi_s(12)$ | $\pi_s(13)$ | $\pi_s(14)$ | |
| | 13 | 4 | 12 | 11 | 3 | 10 | 9 | 8 |
| | 2 | 7 | 6 | 1 | 5 | 14 | 0 | |

TABLE 19

Order of parity bits group to be punctured

| 16200, 1/3 16 QAM | $\pi_P(0)$ | $\pi_P(1)$ | $\pi_P(2)$ | $\pi_P(3)$ | $\pi_P(4)$ | $\pi_P(5)$ | $\pi_P(6)$ | $\pi_P(7)$ |
|---|---|---|---|---|---|---|---|---|
| | $\pi_P(8)$ | $\pi_P(9)$ | $\pi_P(10)$ | $\pi_P(11)$ | $\pi_P(12)$ | $\pi_P(13)$ | $\pi_P(14)$ | $\pi_P(15)$ |
| | $\pi_P(16)$ | $\pi_P(17)$ | $\pi_P(18)$ | $\pi_P(19)$ | $\pi_P(20)$ | $\pi_P(21)$ | $\pi_P(22)$ | $\pi_P(23)$ |
| | $\pi_P(24)$ | $\pi_P(25)$ | $\pi_P(26)$ | $\pi_P(27)$ | $\pi_P(28)$ | $\pi_P(29)$ | | |
| | 27 | 7 | 1 | 20 | 13 | 15 | 29 | 24 |
| | 3 | 26 | 21 | 9 | 18 | 23 | 8 | 28 |
| | 10 | 14 | 22 | 4 | 17 | 11 | 2 | 19 |
| | 6 | 12 | 25 | 16 | 0 | 5 | | |

When a 16QAM modulation scheme is used based on the parity-check matrix for which '$N_{ldpc}$' is equal to '16200' and 'R' is equal to '1;3' as in Table 3 above, and 'A=9/5' and 'B=0' of Equation (11) above are given, a shortening pattern is defined as in Table 20 as follows, and a puncturing pattern is defined as in Table 21 as follows.

TABLE 20

Order of information bits group to be shortened

| 16200, 1/3 16 QAM | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ |
|---|---|---|---|---|---|---|---|---|
| | $\pi_s(8)$ | $\pi_s(9)$ | $\pi_s(10)$ | $\pi_s(11)$ | $\pi_s(12)$ | $\pi_s(13)$ | $\pi_s(14)$ | |
| | 13 | 12 | 4 | 11 | 3 | 10 | 9 | 2 |
| | 6 | 7 | 6 | 1 | 5 | 14 | 0 | |

TABLE 21

Order of parity bits group to be punctured

| 16200, 1/3 16 QAM | $\pi_P(0)$ | $\pi_P(1)$ | $\pi_P(2)$ | $\pi_P(3)$ | $\pi_P(4)$ | $\pi_P(5)$ | $\pi_P(6)$ | $\pi_P(7)$ |
|---|---|---|---|---|---|---|---|---|
| | $\pi_P(8)$ | $\pi_P(9)$ | $\pi_P(10)$ | $\pi_P(11)$ | $\pi_P(12)$ | $\pi_P(13)$ | $\pi_P(14)$ | $\pi_P(15)$ |
| | $\pi_P(16)$ | $\pi_P(17)$ | $\pi_P(18)$ | $\pi_P(19)$ | $\pi_P(20)$ | $\pi_P(21)$ | $\pi_P(22)$ | $\pi_P(23)$ |
| | $\pi_P(24)$ | $\pi_P(25)$ | $\pi_P(26)$ | $\pi_P(27)$ | $\pi_P(28)$ | $\pi_P(29)$ | | |
| | 27 | 7 | 3 | 13 | 1 | 19 | 15 | 25 |
| | 21 | 23 | 29 | 28 | 9 | 22 | 18 | 8 |
| | 14 | 10 | 24 | 0 | 5 | 17 | 11 | 4 |
| | 20 | 6 | 2 | 12 | 16 | 26 | | |

When a BPSK or QPSK modulation scheme is used based on the parity-check matrix for which '$N_{ldpc}$' is equal to '16200' and 'R' is equal to '1/5' as in Table 4 above, and 'A=7/2' and 'B=0' of Equation (11) above are given, a shortening pattern is defined as in Table 22 as follows, and a puncturing pattern is defined as in Table 23 as follows.

TABLE 22

Order of information bits group to be shortened

| 16200, 1/5 BPSK/QPSK | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| | 7 | 3 | 6 | 5 | 2 | 4 | 1 | 8 | 0 |

TABLE 23

Order of parity bits group to be punctured

| 16200, 1/5 BPSK/QPSK | $\pi_P(0)$ | $\pi_P(1)$ | $\pi_P(2)$ | $\pi_P(3)$ | $\pi_P(4)$ | $\pi_P(5)$ | $\pi_P(6)$ | $\pi_P(7)$ | $\pi_P(8)$ |
|---|---|---|---|---|---|---|---|---|---|
| | $\pi_P(9)$ | $\pi_P(10)$ | $\pi_P(11)$ | $\pi_P(12)$ | $\pi_P(13)$ | $\pi_P(14)$ | $\pi_P(15)$ | $\pi_P(16)$ | $\pi_P(17)$ |
| | $\pi_P(18)$ | $\pi_P(19)$ | $\pi_P(20)$ | $\pi_P(21)$ | $\pi_P(22)$ | $\pi_P(23)$ | $\pi_P(24)$ | $\pi_P(25)$ | $\pi_P(26)$ |
| | $\pi_P(27)$ | $\pi_P(28)$ | $\pi_P(29)$ | $\pi_P(30)$ | $\pi_P(31)$ | $\pi_P(32)$ | $\pi_P(33)$ | $\pi_P(34)$ | $\pi_P(35)$ |
| | 27 | 14 | 29 | 32 | 5 | 12 | 21 | 0 | 33 |
| | 25 | 18 | 20 | 28 | 35 | 2 | 8 | 10 | 31 |
| | 11 | 7 | 24 | 22 | 17 | 4 | 23 | 1 | 16 |
| | 34 | 19 | 6 | 13 | 30 | 15 | 3 | 26 | 9 |

When a BPSK or QPSK modulation scheme is used based on the parity-check matrix for which '$N_{ldpc}$' is equal to '16200' and 'R' is equal to '1/5' as in Table 4 above, and 'A=11/3' and 'B=0' of Equation (11) above are given, a shortening pattern is defined as in Table 24 as follows, and a puncturing pattern is defined as in Table 25 as follows.

TABLE 24

Order of information bits group to be shortened

| 16200, 1/5 BPSK/QPSK | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| | 7 | 6 | 3 | 5 | 2 | 4 | 1 | 8 | 0 |

TABLE 25

Order of parity bits group to be punctured

| 16200, 1/5 BPSK/QPSK | $\pi_P(0)$ | $\pi_P(1)$ | $\pi_P(2)$ | $\pi_P(3)$ | $\pi_P(4)$ | $\pi_P(5)$ | $\pi_P(6)$ | $\pi_P(7)$ | $\pi_P(8)$ |
|---|---|---|---|---|---|---|---|---|---|
| | $\pi_P(9)$ | $\pi_P(10)$ | $\pi_P(11)$ | $\pi_P(12)$ | $\pi_P(13)$ | $\pi_P(14)$ | $\pi_P(15)$ | $\pi_P(16)$ | $\pi_P(17)$ |
| | $\pi_P(18)$ | $\pi_P(19)$ | $\pi_P(20)$ | $\pi_P(21)$ | $\pi_P(22)$ | $\pi_P(23)$ | $\pi_P(24)$ | $\pi_P(25)$ | $\pi_P(26)$ |
| | $\pi_P(27)$ | $\pi_P(28)$ | $\pi_P(29)$ | $\pi_P(30)$ | $\pi_P(31)$ | $\pi_P(32)$ | $\pi_P(33)$ | $\pi_P(34)$ | $\pi_P(35)$ |
| | 27 | 14 | 29 | 26 | 33 | 12 | 19 | 5 | 21 |
| | 0 | 31 | 34 | 22 | 17 | 24 | 2 | 8 | 10 |
| | 7 | 23 | 35 | 30 | 4 | 18 | 1 | 20 | 11 |
| | 25 | 32 | 16 | 6 | 13 | 3 | 15 | 9 | 28 |

When a BPSK or QPSK modulation scheme is used based on the parity-check matrix for which '$N_{ldpc}$' is equal to '16200' and 'R' is equal to '1/5' as in Table 4 above, and 'A=15/4' and 'B=0' of Equation (11) above are given, a shortening pattern is defined as in Table 26 as follows, and a puncturing pattern is defined as in Table 27 as follows.

TABLE 26

Order of information bits group to be shortened

| 16200, 1/5 BPSK/QPSK | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| | 7 | 6 | 3 | 5 | 2 | 4 | 1 | 8 | 0 |

TABLE 27

Order of parity bits group to be punctured

| 16200, 1/5 BPSK/QPSK | $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ | $\pi_p(8)$ |
|---|---|---|---|---|---|---|---|---|---|
| | $\pi_p(9)$ | $\pi_p(10)$ | $\pi_p(11)$ | $\pi_p(12)$ | $\pi_p(13)$ | $\pi_p(14)$ | $\pi_p(15)$ | $\pi_p(16)$ | $\pi_p(17)$ |
| | $\pi_p(18)$ | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ |
| | $\pi_p(27)$ | $\pi_p(28)$ | $\pi_p(29)$ | $\pi_p(30)$ | $\pi_p(31)$ | $\pi_p(32)$ | $\pi_p(33)$ | $\pi_p(34)$ | $\pi_p(35)$ |
| | 27 | 14 | 29 | 26 | 33 | 12 | 19 | 5 | 21 |
| | 0 | 31 | 34 | 22 | 17 | 24 | 2 | 8 | 10 |
| | 7 | 23 | 35 | 30 | 4 | 18 | 1 | 11 | 20 |
| | 25 | 32 | 16 | 6 | 13 | 3 | 15 | 9 | 26 |

When a 16QAM modulation scheme is used based on the parity-check matrix for which '$N_{ldpc}$' is equal to '16200' and 'R' is equal to '1/5' as in Table 4 above, and 'A=7/2' and 'B=0' of Equation (11) above are given, a shortening pattern is defined as in Table 28 as follows, and a puncturing pattern is defined as in Table 29 as follows.

TABLE 28

Order of information bits group to be shortened

| 16200, 1/5 16QAM | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| | 7 | 6 | 3 | 5 | 2 | 4 | 1 | 8 | 0 |

TABLE 29

Order of parity bits group to be punctured

| 16200, 1/5 16QAM | $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ | $\pi_p(8)$ |
|---|---|---|---|---|---|---|---|---|---|
| | $\pi_p(9)$ | $\pi_p(10)$ | $\pi_p(11)$ | $\pi_p(12)$ | $\pi_p(13)$ | $\pi_p(14)$ | $\pi_p(15)$ | $\pi_p(16)$ | $\pi_p(17)$ |
| | $\pi_p(18)$ | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ |
| | $\pi_p(27)$ | $\pi_p(28)$ | $\pi_p(29)$ | $\pi_p(30)$ | $\pi_p(31)$ | $\pi_p(32)$ | $\pi_p(33)$ | $\pi_p(34)$ | $\pi_p(35)$ |
| | 27 | 14 | 29 | 32 | 26 | 21 | 12 | 5 | 33 |
| | 20 | 0 | 35 | 24 | 2 | 7 | 9 | 17 | 31 |
| | 19 | 23 | 30 | 6 | 18 | 1 | 11 | 0 | 16 |
| | 25 | 34 | 4 | 13 | 22 | 28 | 3 | 10 | 15 |

When a 16QAM modulation scheme is used based on the parity-check matrix for which '$N_{ldpc}$' is equal to '16200' and 'R' is equal to '1/5' as in Table 4 above, and 'A=11/3' and 'B=0' of Equation (11) above are given, a shortening pattern is defined as in Table 30 as follows and a puncturing pattern is defined as in Table 31 as follows.

TABLE 30

Order of information bits group to be shortened

| 16200, 1/5 16QAM | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| | 7 | 6 | 3 | 5 | 2 | 4 | 1 | 8 | 0 |

TABLE 31

Order of parity bits group to be punctured

| 16200, 1/5 16 QAM | $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ | $\pi_p(8)$ |
|---|---|---|---|---|---|---|---|---|---|
| | $\pi_p(9)$ | $\pi_p(10)$ | $\pi_p(11)$ | $\pi_p(12)$ | $\pi_p(13)$ | $\pi_p(14)$ | $\pi_p(15)$ | $\pi_p(16)$ | $\pi_p(17)$ |
| | $\pi_p(18)$ | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ |
| | $\pi_p(27)$ | $\pi_p(28)$ | $\pi_p(29)$ | $\pi_p(30)$ | $\pi_p(31)$ | $\pi_p(32)$ | $\pi_p(33)$ | $\pi_p(34)$ | $\pi_p(35)$ |
| | 27 | 13 | 29 | 26 | 33 | 22 | 6 | 20 | 0 |
| | 32 | 35 | 11 | 17 | 21 | 25 | 7 | 2 | 9 |
| | 31 | 8 | 14 | 30 | 1 | 18 | 23 | 4 | 16 |
| | 19 | 10 | 34 | 3 | 12 | 24 | 5 | 15 | 28 |

When a 16QAM modulation scheme is used based on the parity-check matrix for which '$N_{ldpc}$' is equal to '16200' and 'R' is equal to '1/5' as in Table 4 above, and 'A=15/4' and 'B=0' of Equation (11) above are given, a shortening pattern is defined as in Table 32 as follows, and a puncturing pattern is defined as in Table 33 as follows.

TABLE 32

Order of information bits group to be shortened

| 16200, 1/5 16QAM | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| | 7 | 6 | 3 | 5 | 2 | 4 | 1 | 8 | 0 |

TABLE 33

Order of parity bits group to be punctured

| 16200, 1/5 16 QAM | $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ | $\pi_p(8)$ |
|---|---|---|---|---|---|---|---|---|---|
| | $\pi_p(9)$ | $\pi_p(10)$ | $\pi_p(11)$ | $\pi_p(12)$ | $\pi_p(13)$ | $\pi_p(14)$ | $\pi_p(15)$ | $\pi_p(16)$ | $\pi_p(17)$ |
| | $\pi_p(18)$ | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ |
| | $\pi_p(27)$ | $\pi_p(28)$ | $\pi_p(29)$ | $\pi_p(30)$ | $\pi_p(31)$ | $\pi_p(32)$ | $\pi_p(33)$ | $\pi_p(34)$ | $\pi_p(35)$ |
| | 13 | 26 | 28 | 29 | 33 | 22 | 20 | 6 | 32 |
| | 0 | 11 | 7 | 35 | 17 | 21 | 24 | 7 | 9 |
| | 31 | 30 | 14 | 18 | 8 | 1 | 23 | 4 | 25 |
| | 16 | 10 | 19 | 3 | 12 | 5 | 15 | 21 | 34 |

When a BPSK, QPSK or 16QAM modulation scheme is used based on the parity-check matrix for which '$N_{ldpc}$' is equal to '4320' and 'R' is equal to '1/4' as in Table 8 above, and 'A=7/4' and 'B=0', or 'A=9/5' and 'B=0' of Equation (11) above are given, a shortening pattern is defined as in Table 34 as follows, and a puncturing pattern is defined as in Table 35 as follows.

TABLE 34

Order of information bits group to be shortened

| 4320, 1/4 BPSK/ QPSK/ 16QAM | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| | $\pi_s(9)$ | $\pi_s(10)$ | $\pi_s(11)$ | $\pi_s(12)$ | $\pi_s(13)$ | $\pi_s(14)$ | | | |
| | 11 | 10 | 9 | 8 | 7 | 6 | 5 | 4 | 3 |
| | 2 | 14 | 13 | 12 | 1 | 0 | | | |

TABLE 35

Order of parity group to be punctured

| 4320, 1/4 BPSK/ QPSK/ 16QAM | $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ | $\pi_p(8)$ |
|---|---|---|---|---|---|---|---|---|---|
| | $\pi_p(9)$ | $\pi_p(10)$ | $\pi_p(11)$ | $\pi_p(12)$ | $\pi_p(13)$ | $\pi_p(14)$ | $\pi_p(15)$ | $\pi_p(16)$ | $\pi_p(17)$ |
| | $\pi_p(18)$ | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ |
| | $\pi_p(27)$ | $\pi_p(28)$ | $\pi_p(29)$ | $\pi_p(30)$ | $\pi_p(31)$ | $\pi_p(32)$ | $\pi_p(33)$ | $\pi_p(34)$ | $\pi_p(35)$ |
| | $\pi_p(36)$ | $\pi_p(37)$ | $\pi_p(38)$ | $\pi_p(39)$ | $\pi_p(40)$ | $\pi_p(41)$ | $\pi_p(42)$ | $\pi_p(43)$ | $\pi_p(44)$ |
| | 26 | 14 | 1 | 36 | 42 | 8 | 16 | 12 | 4 |
| | 20 | 10 | 2 | 31 | 7 | 27 | 41 | 18 | 39 |
| | 28 | 15 | 0 | 3 | 5 | 6 | 9 | 11 | 13 |
| | 17 | 19 | 21 | 22 | 23 | 24 | 25 | 29 | 30 |
| | 32 | 33 | 34 | 35 | 37 | 38 | 40 | 43 | 44 |

When a BPSK or QPSK modulation scheme is used based on the parity-check matrix for which '$N_{ldpc}$' is equal to '4320' and 'R' is equal to '1/5' as in Table 9 above, and 'A=15/4' and 'B=0' of Equation (11) above are given, a shortening pattern is defined as in Table 36 as follows, and a puncturing pattern is defined as in Table 37 as follows.

TABLE 36

Order of bits group to be shortened $\pi_s(j)$ $(0 \le j < N_{group})$

| Modulation and Code rate | $N_{group}$ | $\pi_s(0)$ $\pi_s(9)$ | $\pi_s(1)$ $\pi_s(10)$ | $\pi_s(2)$ $\pi_s(11)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|---|
| BPSK 1/5 | 12 | 6 7 | 5 10 | 4 11 | 9 | 3 | 2 | 1 | 8 | 0 |

When the number of parity bits of a BCH code is equal to or greater than 'M=72', '$\pi_s(11)=11$' is deleted.

is defined as in Table 40 as follows, and a puncturing pattern is defined as in Table 41 as follows.

TABLE 37

Order of parity group to be punctured, $\{\pi_p(j), 0 \le j < Q_{ldpc} = 48\}$

| Modulation and Code rate | $\pi_p(0)$ $\pi_p(1)$ $\pi_p(2)$ $\pi_p(3)$ $\pi_p(4)$ $\pi_p(5)$ $\pi_p(6)$ $\pi_p(7)$ $\pi_p(8)$ $\pi_p(9)$ $\pi_p(10)$ $\pi_p(11)$ $\pi_p(12)$ $\pi_p(13)$ $\pi_p(14)$ $\pi_p(15)$ $\pi_p(16)$ $\pi_p(17)$ $\pi_p(18)$ $\pi_p(19)$ $\pi_p(20)$ $\pi_p(21)$ $\pi_p(22)$ $\pi_p(23)$ $\pi_p(24)$ $\pi_p(25)$ $\pi_p(26)$ $\pi_p(27)$ $\pi_p(28)$ $\pi_p(29)$ $\pi_p(30)$ $\pi_p(31)$ $\pi_p(32)$ $\pi_p(33)$ $\pi_p(34)$ $\pi_p(35)$ $\pi_p(36)$ $\pi_p(37)$ $\pi_p(38)$ $\pi_p(39)$ $\pi_p(40)$ $\pi_p(41)$ $\pi_p(42)$ $\pi_p(43)$ $\pi_p(44)$ $\pi_p(45)$ $\pi_p(46)$ $\pi_p(47)$ |
|---|---|
| BPSK 1/5 | 29 45 43 27 32 35 40 38 0 19 8 16 41 4 26 36 30 2 13 42 46 24 37 1 33 11 44 28 20 9 34 3 17 6 21 14 23 7 22 47 5 10 12 15 18 25 31 39 |

When a BPSK or QPSK modulation scheme is used based on the parity-check matrix for which '$N_{ldpc}$' is equal to '4320' and 'R' is equal to '1/5' as in Table 9 above, and 'A=15/4' and 'B=525' of Equation (11) above are given, a shortening pattern is defined as in Table 38 as follows, and a puncturing pattern is defined as in Table 39 as follows.

TABLE 38

Order of information bits group to be shortened

| 4320, 1/5 BPSK/ QPSK | $\pi_s(0)$ $\pi_s(1)$ $\pi_s(2)$ $\pi_s(3)$ $\pi_s(4)$ $\pi_s(5)$ $\pi_s(6)$ $\pi_s(7)$ $\pi_s(8)$ $\pi_s(9)$ $\pi_s(10)$ $\pi_s(11)$ 6 5 4 3 2 1 0 9 8 7 10 11 |
|---|---|

When the number of parity bits of a BCH code is greater than or equal to 'M=72', '$\pi_s(11)=11$' is deleted.

TABLE 39

Order of parity bits group to be punctured

| 4320, 1/5 BPSK/ QPSK | $\pi_p(0)$ $\pi_p(1)$ $\pi_p(2)$ $\pi_p(3)$ $\pi_p(4)$ $\pi_p(5)$ $\pi_p(6)$ $\pi_p(7)$ $\pi_p(8)$ $\pi_p(9)$ $\pi_p(10)$ $\pi_p(11)$ $\pi_p(12)$ $\pi_p(13)$ $\pi_p(14)$ $\pi_p(15)$ $\pi_p(16)$ $\pi_p(17)$ $\pi_p(18)$ $\pi_p(19)$ $\pi_p(20)$ $\pi_p(21)$ $\pi_p(22)$ $\pi_p(23)$ $\pi_p(24)$ $\pi_p(25)$ $\pi_p(26)$ $\pi_p(27)$ $\pi_p(28)$ $\pi_p(29)$ $\pi_p(30)$ $\pi_p(31)$ $\pi_p(32)$ $\pi_p(33)$ $\pi_p(34)$ $\pi_p(35)$ $\pi_p(36)$ $\pi_p(37)$ $\pi_p(38)$ $\pi_p(39)$ $\pi_p(40)$ $\pi_p(41)$ $\pi_p(42)$ $\pi_p(43)$ $\pi_p(44)$ $\pi_p(45)$ $\pi_p(46)$ $\pi_p(47)$ 29 45 42 27 40 0 39 34 31 16 5 37 19 8 33 41 2 47 13 10 24 21 28 35 1 44 26 30 43 36 3 12 17 6 20 9 23 32 46 25 4 15 11 22 7 18 38 14 |
|---|---|

When a BPSK or QPSK modulation scheme is used based on the parity-check matrix for which '$N_{ldpc}$' is equal to '4320' and 'R' is equal to '1/5' as in Table 9 above, and 'A=7/2' and 'B=0' of Equation (11) above are given, a shortening pattern

TABLE 40

Order of information bits group to be shortened

| 4320, 1/5 BPSK/ QPSK | $\pi_s(0)$ $\pi_s(1)$ $\pi_s(2)$ $\pi_s(3)$ $\pi_s(4)$ $\pi_s(5)$ $\pi_s(6)$ $\pi_s(7)$ $\pi_s(8)$ $\pi_s(9)$ $\pi_s(10)$ $\pi_s(11)$ 6 5 4 3 2 9 1 0 8 7 10 11 |
|---|---|

When the number of parity bits of a BCH code is equal to or greater than 'M=72', '$\pi_s(11)=11$' is deleted.

TABLE 41

Order of parity bits group to be punctured

| 4320, 1/5 BPSK/ QPSK | $\pi_p(0)$ $\pi_p(1)$ $\pi_p(2)$ $\pi_p(3)$ $\pi_p(4)$ $\pi_p(5)$ $\pi_p(6)$ $\pi_p(7)$ $\pi_p(8)$ $\pi_p(9)$ $\pi_p(10)$ $\pi_p(11)$ $\pi_p(12)$ $\pi_p(13)$ $\pi_p(14)$ $\pi_p(15)$ $\pi_p(16)$ $\pi_p(17)$ $\pi_p(18)$ $\pi_p(19)$ $\pi_p(20)$ $\pi_p(21)$ $\pi_p(22)$ $\pi_p(23)$ $\pi_p(24)$ $\pi_p(25)$ $\pi_p(26)$ $\pi_p(27)$ $\pi_p(28)$ $\pi_p(29)$ $\pi_p(30)$ $\pi_p(31)$ $\pi_p(32)$ $\pi_p(33)$ $\pi_p(34)$ $\pi_p(35)$ $\pi_p(36)$ $\pi_p(37)$ $\pi_p(38)$ $\pi_p(39)$ $\pi_p(40)$ $\pi_p(41)$ $\pi_p(42)$ $\pi_p(43)$ $\pi_p(44)$ $\pi_p(45)$ $\pi_p(46)$ $\pi_p(47)$ 45 29 43 27 32 35 40 38 0 19 8 46 41 16 5 37 25 2 13 33 11 1 22 42 28 36 9 20 24 6 3 17 31 44 34 10 26 21 39 47 14 18 12 23 4 30 7 15 |
|---|---|

When a BPSK or QPSK modulation scheme is used based on the parity-check matrix for which '$N_{ldpc}$' is equal to '4320' and 'R' is equal to '1/3' as in Table 7 above, and 'A=9/5' and 'B=380' of Equation (11) above are given, a shortening pattern is defined as in Table 42 as follows, and a puncturing pattern is defined as in Table 43 as follows.

TABLE 42

Order of information bits group to be shortened

| 4320, 1/3 BPSK/ | $\pi_s(0)$ $\pi_s(1)$ $\pi_s(2)$ $\pi_s(3)$ $\pi_s(4)$ $\pi_s(5)$ $\pi_s(6)$ $\pi_s(7)$ $\pi_s(8)$ $\pi_s(9)$ $\pi_s(10)$ $\pi_s(11)$ $\pi_s(12)$ $\pi_s(13)$ $\pi_s(14)$ $\pi_s(15)$ $\pi_s(16)$ $\pi_s(17)$ $\pi_s(18)$ $\pi_s(19)$ |
|---|---|

TABLE 42-continued

| | Order of information bits group to be shortened | | | | | | | |
|---|---|---|---|---|---|---|---|---|
| QPSK | 17 | 16 | 15 | 14 | 13 | 12 | 11 | 10 | 9 |
| | 8 | 7 | 6 | 5 | 4 | 3 | 1 | 2 | 0 |
| | 18 | 19 | | | | | | | |

When the number of parity bits of a BCH code is greater than or equal to 'M=72', '$\pi_s(19)=19$' is deleted.

TABLE 43

| | Order of parity bits group to be punctured |
|---|---|
| 4320, 1/3 BPSK/ QPSK | $\pi_p(0)$ $\pi_p(1)$ $\pi_p(2)$ $\pi_p(3)$ $\pi_p(4)$ $\pi_p(5)$ $\pi_p(6)$ $\pi_p(7)$ $\pi_p(8)$ $\pi_p(9)$ $\pi_p(10)$ $\pi_p(11)$ $\pi_p(12)$ $\pi_p(13)$ $\pi_p(14)$ $\pi_p(15)$ $\pi_p(16)$ $\pi_p(17)$ $\pi_p(18)$ $\pi_p(19)$ $\pi_p(20)$ $\pi_p(21)$ $\pi_p(22)$ $\pi_p(23)$ $\pi_p(24)$ $\pi_p(25)$ $\pi_p(26)$ $\pi_p(27)$ $\pi_p(28)$ $\pi_p(29)$ $\pi_p(30)$ $\pi_p(31)$ $\pi_p(32)$ $\pi_p(33)$ $\pi_p(34)$ $\pi_p(35)$ $\pi_p(36)$ $\pi_p(37)$ $\pi_p(38)$ $\pi_p(39)$ |
| | 25 42 49 51 55 53 57 34 23 |
| | 32 21 40 30 47 20 38 28 46 |
| | 31 39 52 33 41 22 24 26 27 |
| | 29 35 36 37 43 44 45 48 50 |
| | 54 56 58 59 |

As described above with reference to FIG. 3, when a position of a column group of the parity-check matrix changes, even a shortening pattern can change to correspond thereto. For instance, a column group of a high degree is arranged at the foremost part of the parity-check matrix.

When the LDPC codeword length ($N_{ldpc}$) is equal to '4320', the coding rate (R) is equal to '1/4', and 'M' is equal to '72', the parity-check matrix of Table 8 above is changeable as in Table 44 as follows.

TABLE 44

Index of row in which 1 is positioned in $0^{th}$ column of column group 0 127 213 714 816 1031 1456 1815 2097 2183 2404 2934 2999 3153
1 22 65 390 1022 1046 1465 1498 1682 1879 2108 2164 2203 3106
2 73 185 355 1381 1672 1998 2406 2577 2600 2834 3084 3115 3150
3 1087 2681 2894 3123
4 595 679 1206 1486
5 1842 2038 2169 2312
6 500 992 1230 2630
7 916 1217 1632 2798
8 876 1213 2191 2261
9 633 2559 2869 2907
10 581 1178 1922 2998
11 665 2539 2669 3010
12 2273 2320 2774 2976
13 1020 1147 1792 2609
14 1343 1563 2745 3039

When the codeword length ($N_{ldpc}$) is equal to '4320', the coding rate (R) is equal to '1/3', and 'M' is equal to '72', the parity-check matrix of Table 9 above is changeable as in Table 45 as follows.

TABLE 45

Index of row in which 1 is positioned in $0^{th}$ column of column group 0 102 514 828 1010 1024 1663 1737 1870 2154 2390 2523 2759 3380
1 216 383 679 938 970 975 1668 2212 2300 2381 2413 2754 2997
2 536 889 993 1395 1603 1691 2078 2344 2545 2741 3157 3334 3377
3 1047 1176 1742 1779
4 304 890 1817 2645
5 102 316 353 2250
6 488 811 1662 2323
7 31 2397 2468 3321
8 407 1907 2268 2594
9 384 944 1269 2266
10 694 1115 1167 2548
11 1266 1993 3229 3415

In a system performing LDPC coding based on the changed parity-check matrix, even a shortening pattern is possible to change correspondingly to the changed parity-check matrix as described above with reference to FIG. 3. However, the identical puncturing pattern is used because only an information word part matrix of the parity-check matrix changes.

When a BPSK, QPSK or 16QAM modulation scheme is used based on the parity-check matrix for which '$N_{ldpc}$' is equal to '4320' and 'R' is equal to '1/4' as in Table 44 above, and 'A=7/4' and 'B=0' or 'A=5/9' and 'B=0' of Equation 11 above are given, a shortening pattern is defined as in Table 46 as follows, and a puncturing pattern is defined as in Table 47 as follows.

TABLE 46

| | Order of information bits group to be shortened | | | | | | | | |
|---|---|---|---|---|---|---|---|---|---|
| 4320, 1/4 BPSK/QPSK | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ |
| | $\pi_s(9)$ | $\pi_s(10)$ | $\pi_s(11)$ | $\pi_s(12)$ | $\pi_s(13)$ | $\pi_s(14)$ | | | |
| | 3 | 4 | 5 | 6 | 7 | 8 | 9 | 10 | 11 |
| | 12 | 0 | 1 | 2 | 13 | 14 | | | |

When the number of parity bits of a BCH code is equal to or greater than 'M=72', '$\pi_s(14)=14$' is deleted.

TABLE 47

Order of parity bits group to be punctured

| 4320, 1/4 BPSK/ QPSK | $\pi_p(0)$ $\pi_p(9)$ $\pi_p(18)$ $\pi_p(27)$ $\pi_p(36)$ | $\pi_p(1)$ $\pi_p(10)$ $\pi_p(19)$ $\pi_p(28)$ $\pi_p(37)$ | $\pi_p(2)$ $\pi_p(11)$ $\pi_p(20)$ $\pi_p(29)$ $\pi_p(38)$ | $\pi_p(3)$ $\pi_p(12)$ $\pi_p(21)$ $\pi_p(30)$ $\pi_p(39)$ | $\pi_p(4)$ $\pi_p(13)$ $\pi_p(22)$ $\pi_p(31)$ $\pi_p(40)$ | $\pi_p(5)$ $\pi_p(14)$ $\pi_p(23)$ $\pi_p(32)$ $\pi_p(41)$ | $\pi_p(6)$ $\pi_p(15)$ $\pi_p(24)$ $\pi_p(33)$ $\pi_p(42)$ | $\pi_p(7)$ $\pi_p(16)$ $\pi_p(25)$ $\pi_p(34)$ $\pi_p(43)$ | $\pi_p(8)$ $\pi_p(17)$ $\pi_p(26)$ $\pi_p(35)$ $\pi_p(44)$ |
|---|---|---|---|---|---|---|---|---|---|
| | 26 | 14 | 1 | 36 | 42 | 8 | 16 | 12 | 4 |
| | 20 | 10 | 2 | 31 | 7 | 27 | 41 | 18 | 39 |
| | 28 | 15 | 0 | 3 | 5 | 6 | 9 | 11 | 13 |
| | 17 | 19 | 21 | 22 | 23 | 24 | 25 | 29 | 30 |
| | 32 | 33 | 34 | 35 | 37 | 38 | 40 | 43 | 44 |

When a BPSK or QPSK modulation scheme is used based on the parity-check matrix for which '$N_{ldpc}$' is equal to '4320' and 'R' is equal to '1/5' as in Table 45 above, and 'A=15/4' and 'B=0' of Equation 11 above are given, a shortening pattern is defined as in Table 48 as follows, and a puncturing pattern is defined as in Table 49 as follows.

TABLE 48

Order of information bits group to be shortened

| 4320, 1/5 BPSK/ QPSK | $\pi_s(0)$ $\pi_s(9)$ | $\pi_s(1)$ $\pi_s(10)$ | $\pi_s(2)$ $\pi_s(11)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| | 7 | 6 | 5 | 2 | 4 | 3 | 8 | 1 | 9 |
| | 0 | 10 | 11 | | | | | | |

When the number of parity bits of a BCH code is equal to or greater than 'M=72', '$\pi_s(11)=11$' is deleted.

TABLE 49

Order of parity bits group to be punctured

| 4320, 1/5 BPSK/ QPSK | $\pi_p(0)$ $\pi_p(9)$ $\pi_p(18)$ $\pi_p(27)$ $\pi_p(36)$ $\pi_p(45)$ | $\pi_p(1)$ $\pi_p(10)$ $\pi_p(19)$ $\pi_p(28)$ $\pi_p(37)$ $\pi_p(46)$ | $\pi_p(2)$ $\pi_p(11)$ $\pi_p(20)$ $\pi_p(29)$ $\pi_p(38)$ $\pi_p(47)$ | $\pi_p(3)$ $\pi_p(12)$ $\pi_p(21)$ $\pi_p(30)$ $\pi_p(39)$ | $\pi_p(4)$ $\pi_p(13)$ $\pi_p(22)$ $\pi_p(31)$ $\pi_p(40)$ | $\pi_p(5)$ $\pi_p(14)$ $\pi_p(23)$ $\pi_p(32)$ $\pi_p(41)$ | $\pi_p(6)$ $\pi_p(15)$ $\pi_p(24)$ $\pi_p(33)$ $\pi_p(42)$ | $\pi_p(7)$ $\pi_p(16)$ $\pi_p(25)$ $\pi_p(34)$ $\pi_p(43)$ | $\pi_p(8)$ $\pi_p(17)$ $\pi_p(26)$ $\pi_p(35)$ $\pi_p(44)$ |
|---|---|---|---|---|---|---|---|---|---|
| | 29 | 45 | 43 | 27 | 32 | 35 | 40 | 38 | 0 |
| | 19 | 8 | 16 | 41 | 4 | 26 | 36 | 30 | 2 |
| | 13 | 42 | 46 | 24 | 37 | 1 | 33 | 11 | 44 |
| | 28 | 20 | 9 | 34 | 3 | 17 | 6 | 21 | 14 |
| | 23 | 7 | 22 | 47 | 5 | 10 | 12 | 15 | 18 |
| | 25 | 31 | 39 | | | | | | |

When a BPSK or QPSK modulation scheme is used based on the parity-check matrix for which '$N_{ldpc}$' is equal to '4320' and 'R' is equal to '1/5' as in Table 45 above, and 'A=15/4' and 'B=525' of Equation 11 above are given, a shortening pattern is defined as in Table 50 as follows, and a puncturing pattern is defined as in Table 51 as follows.

TABLE 50

Order of information bits group to be shortened

| 4320, 1/5 BPSK/ QPSK | $\pi_s(0)$ $\pi_s(9)$ | $\pi_s(1)$ $\pi_s(10)$ | $\pi_s(2)$ $\pi_s(11)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| | 7 | 6 | 5 | 4 | 3 | 8 | 9 | 2 | 1 |
| | 0 | 10 | 11 | | | | | | |

When the number of parity bits of a BCH code is equal to or greater than 'M=72', '$\pi_s(11)=11$' is deleted.

TABLE 51

Order of Parity bits group to be punctured

| 4320, 1/5 BPSK/ QPSK | $\pi_p(0)$ $\pi_p(9)$ $\pi_p(18)$ $\pi_p(27)$ $\pi_p(36)$ $\pi_p(45)$ | $\pi_p(1)$ $\pi_p(10)$ $\pi_p(19)$ $\pi_p(28)$ $\pi_p(37)$ $\pi_p(46)$ | $\pi_p(2)$ $\pi_p(11)$ $\pi_p(20)$ $\pi_p(29)$ $\pi_p(38)$ $\pi_p(47)$ | $\pi_p(3)$ $\pi_p(12)$ $\pi_p(21)$ $\pi_p(30)$ $\pi_p(39)$ | $\pi_p(4)$ $\pi_p(13)$ $\pi_p(22)$ $\pi_p(31)$ $\pi_p(40)$ | $\pi_p(5)$ $\pi_p(14)$ $\pi_p(23)$ $\pi_p(32)$ $\pi_p(41)$ | $\pi_p(6)$ $\pi_p(15)$ $\pi_p(24)$ $\pi_p(33)$ $\pi_p(42)$ | $\pi_p(7)$ $\pi_p(16)$ $\pi_p(25)$ $\pi_p(34)$ $\pi_p(43)$ | $\pi_p(8)$ $\pi_p(17)$ $\pi_p(26)$ $\pi_p(35)$ $\pi_p(44)$ |
|---|---|---|---|---|---|---|---|---|---|
| | 29 | 45 | 42 | 27 | 40 | 0 | 39 | 34 | 31 |
| | 16 | 5 | 37 | 19 | 8 | 33 | 41 | 2 | 47 |
| | 13 | 10 | 24 | 21 | 28 | 35 | 1 | 44 | 26 |
| | 30 | 43 | 36 | 3 | 12 | 17 | 6 | 20 | 9 |
| | 23 | 32 | 46 | 25 | 4 | 15 | 11 | 22 | 7 |
| | 18 | 38 | 14 | | | | | | |

When a BPSK or QPSK modulation scheme is used based on the parity-check matrix for which '$N_{ldpc}$' is equal to '4320' and 'R' is equal to '1/5' as in Table 45 above, and 'A=72' and 'B=0' of Equation (11) above are given, a shortening pattern is defined as in Table 52 as follows, and a puncturing pattern is defined as in Table 53 as follows.

TABLE 52

Order of information bits group to be shortened

| 4320, 1/5 BPSK/QPSK | $\pi_s(0)$ $\pi_s(9)$ | $\pi_s(1)$ $\pi_s(10)$ | $\pi_s(2)$ $\pi_s(11)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| | 7 | 6 | 5 | 4 | 3 | 2 | 8 | 9 | 1 |
| | 0 | 10 | 11 | | | | | | |

When the number of parity bits of a BCH code is greater than or equal to 'M=72', '$\pi_s(11)=11$' is deleted.

TABLE 53

Order of parity bits group to be punctured

| 4320, 1/5 BPSK/ QPSK | $\pi_p(0)$ $\pi_p(9)$ $\pi_p(18)$ $\pi_p(27)$ $\pi_p(36)$ $\pi_p(45)$ | $\pi_p(1)$ $\pi_p(10)$ $\pi_p(19)$ $\pi_p(28)$ $\pi_p(37)$ $\pi_p(46)$ | $\pi_p(2)$ $\pi_p(11)$ $\pi_p(20)$ $\pi_p(29)$ $\pi_p(38)$ $\pi_p(47)$ | $\pi_p(3)$ $\pi_p(12)$ $\pi_p(21)$ $\pi_p(30)$ $\pi_p(39)$ | $\pi_p(4)$ $\pi_p(13)$ $\pi_p(22)$ $\pi_p(31)$ $\pi_p(40)$ | $\pi_p(5)$ $\pi_p(14)$ $\pi_p(23)$ $\pi_p(32)$ $\pi_p(41)$ | $\pi_p(6)$ $\pi_p(15)$ $\pi_p(24)$ $\pi_p(33)$ $\pi_p(42)$ | $\pi_p(7)$ $\pi_p(16)$ $\pi_p(25)$ $\pi_p(34)$ $\pi_p(43)$ | $\pi_p(8)$ $\pi_p(17)$ $\pi_p(26)$ $\pi_p(35)$ $\pi_p(44)$ |
|---|---|---|---|---|---|---|---|---|---|
| | 45 | 29 | 43 | 27 | 32 | 35 | 40 | 38 | 0 |
| | 19 | 8 | 46 | 41 | 16 | 5 | 37 | 25 | 2 |
| | 13 | 33 | 11 | 1 | 22 | 42 | 28 | 36 | 9 |
| | 20 | 24 | 6 | 3 | 17 | 31 | 44 | 34 | 10 |
| | 26 | 21 | 39 | 47 | 14 | 18 | 12 | 23 | 4 |
| | 30 | 7 | 15 | | | | | | |

In the present invention, a codeword length, a coding rate, a puncturing and shortening pattern, and a shortening pattern and puncturing pattern based on a modulation scheme have been described through Tables 10 to 43 and 46 to 53 above.

When the LDPC codeword length ($N_{ldpc}$) is equal to '16200', the coding rate (R) is equal to '1/3', and 'M' is equal to '360', another parity-check matrix is given as in Table 54 as follows.

TABLE 54

| i | Index of row in which 1 is positioned in $0^{th}$ column of column group |
|---|---|
| 0 | 77 182 354 816 916 958 1055 1261 1553 1874 2211 2490 2999 3267 3975 5018 5952 6198 6343 7027 7045 7751 7923 8649 9010 9022 9380 9956 10204 10339 |
| 1 | 5 612 1724 1737 1911 1914 2108 2496 2809 4037 5838 6950 8049 8081 9480 9512 9724 9745 9952 10203 10207 10270 10463 10486 10499 10515 10663 10678 10706 10741 |
| 2 | 22 345 1938 3636 4016 5293 6424 6589 7426 7547 8102 9038 9095 9127 9174 9239 9279 9810 10347 10403 10408 10591 10610 10632 10660 10721 10754 10765 10773 10791 |
| 3 | 17 3435 7278 9952 |
| 4 | 1442 2518 3132 7541 |
| 5 | 5464 9226 10615 10658 |
| 6 | 426 2473 8459 10750 |
| 7 | 1862 2111 6236 10546 |
| 8 | 1010 9922 10591 10735 |
| 9 | 29 2663 6553 10749 |
| 10 | 5652 7265 7789 10708 |
| 11 | 4534 5497 10784 |
| 12 | 345 3027 10761 |
| 13 | 2823 4127 10668 |
| 14 | 84 4800 9068 |

When a BPSK or QPSK modulation scheme is used based on the parity-check matrix for which '$N_{ldpc}$' is equal to '16200' and 'R' is equal to '1/3' as in Table 54 above, and 'A=9/5' and 'B=0' of Equation (11) above are given, a shortening pattern is defined as in Table 55 as follows, and a puncturing pattern is defined as in Table 56 as follows.

TABLE 55

Order of information bits group to be shortened

| | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ |
|---|---|---|---|---|---|---|---|---|
| | $\pi_s(8)$ | $\pi_s(9)$ | $\pi_s(10)$ | $\pi_s(11)$ | $\pi_s(12)$ | $\pi_s(13)$ | $\pi_s(14)$ | |
| 16200, 1/3 | 10 | 9 | 2 | 13 | 12 | 8 | 11 | 1 |
| BPSK/QPSK | 7 | 6 | 5 | 4 | 0 | 14 | 3 | |

TABLE 56

Order of parity bits group to be punctured

| | $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ |
|---|---|---|---|---|---|---|---|---|
| | $\pi_p(8)$ | $\pi_p(9)$ | $\pi_p(10)$ | $\pi_p(11)$ | $\pi_p(12)$ | $\pi_p(13)$ | $\pi_p(14)$ | $\pi_p(15)$ |
| | $\pi_p(16)$ | $\pi_p(17)$ | $\pi_p(18)$ | $\pi_p(19)$ | $\pi_p(20)$ | $\pi_p(21)$ | $\pi_p(22)$ | $\pi_p(23)$ |
| | $\pi_p(24)$ | $\pi_p(25)$ | $\pi_p(26)$ | $\pi_p(27)$ | $\pi_p(28)$ | $\pi_p(29)$ | | |
| 16200, 1/3 | 5 | 19 | 9 | 23 | 13 | 27 | 2 | 17 |
| BPSK/QPSK | 21 | 0 | 25 | 15 | 7 | 4 | 11 | 20 |
| | 28 | 8 | 14 | 24 | 12 | 3 | 1 | 6 |
| | 26 | 22 | 10 | 16 | 18 | 29 | | |

When the LDPC codeword length ($N_{ldpc}$) is equal to '16200', the coding rate (R) is equal to '1/5', and 'M' is equal to '360', another parity-check matrix is given as in Table 57 as follows.

TABLE 57

| i | Index of row in which 1 is positioned in $0^{th}$ column of ith column group |
|---|---|
| 0 | 188 518 775 1694 1820 3394 3986 4140 4224 5236 5783 6313 6371 6792 7067 7084 7173 7445 7549 7973 9043 9219 9942 10111 10258 10300 10353 10707 10769 10796 11079 11661 12025 12042 12702 12838 |
| 1 | 7 25 392 557 625 838 1377 2223 2396 3058 3335 3348 3363 3918 4040 4128 4899 5189 5474 5838 6040 6124 7777 8220 8783 9299 9785 10924 11083 11902 12381 12513 12758 12834 12871 12950 |
| 2 | 76 4691 7180 7325 11292 |
| 3 | 6454 8048 12058 12946 |
| 4 | 3953 4932 10808 12700 |

TABLE 57-continued

| i | Index of row in which 1 is positioned in $0^{th}$ column of ith column group |
|---|---|
| 5 | 4605 9117 9921 10662 |
| 6 | 2984 8202 10670 12877 |
| 7 | 4357 6205 7370 10403 |
| 8 | 5559 9847 10911 11147 |

When a BPSK or QPSK modulation scheme is used based on the parity-check matrix for which '$N_{ldpc}$' is equal to '16200' and 'R' is equal to '1/5 ' as in Table 57 above, and 'A=4/15' and 'B=0' of Equation (11) above are given, a shortening pattern is defined as in Table 58 as follows, and a puncturing pattern is defined as in Table 59 as follows.

TABLE 58

Order of information bits group to be shortened

| | $\pi_s(0)$ | $\pi_s(1)$ | $\pi_s(2)$ | $\pi_s(3)$ | $\pi_s(4)$ | $\pi_s(5)$ | $\pi_s(6)$ | $\pi_s(7)$ | $\pi_s(8)$ |
|---|---|---|---|---|---|---|---|---|---|
| 16200, 1/5 BPSK/QPSK | 2 | 6 | 5 | 1 | 4 | 3 | 0 | 8 | 7 |

TABLE 59

Order of parity bits group to be punctured

| | $\pi_p(0)$ | $\pi_p(1)$ | $\pi_p(2)$ | $\pi_p(3)$ | $\pi_p(4)$ | $\pi_p(5)$ | $\pi_p(6)$ | $\pi_p(7)$ | $\pi_p(8)$ |
|---|---|---|---|---|---|---|---|---|---|
| | $\pi_p(9)$ | $\pi_p(10)$ | $\pi_p(11)$ | $\pi_p(12)$ | $\pi_p(13)$ | $\pi_p(14)$ | $\pi_p(15)$ | $\pi_p(16)$ | $\pi_p(17)$ |
| | $\pi_p(18)$ | $\pi_p(19)$ | $\pi_p(20)$ | $\pi_p(21)$ | $\pi_p(22)$ | $\pi_p(23)$ | $\pi_p(24)$ | $\pi_p(25)$ | $\pi_p(26)$ |
| | $\pi_p(27)$ | $\pi_p(28)$ | $\pi_p(29)$ | $\pi_p(30)$ | $\pi_p(31)$ | $\pi_p(32)$ | $\pi_p(33)$ | $\pi_p(34)$ | $\pi_p(35)$ |
| 16200, 1/5 BPSK/ QPSK | 4 | 11 | 17 | 27 | 1 | 14 | 24 | 31 | 6 |
| | 9 | 20 | 33 | 16 | 22 | 29 | 3 | 8 | 19 |
| | 26 | 7 | 13 | 30 | 34 | 0 | 10 | 18 | 25 |
| | 5 | 21 | 32 | 28 | 2 | 15 | 23 | 12 | 35 |

In the present invention, a codeword length, a coding rate, a puncturing and shortening pattern, and a shortening pattern and puncturing pattern based on a modulation scheme have been described through Tables 55, 56, 58 and 59 above.

A process of performing shortening and puncturing in a unit of group using the shortening patterns and puncturing patterns of Tables 10 to 43, Tables 46 to 53, Tables 55 and 56, and Tables 58 to 59 above according to the present invention is described as follows with reference to FIG. 2.

The controller 202 provides a value of BCH information bits' length ($K_{bch}$) and a value of an information bits' length ($K_I$) to the zero padding unit 204. Also, the controller 202 determines the number of punctured bits or punctured parity bit groups, and notifies the puncturing unit 210 of the number of punctured bits or punctured parity bit groups.

According to the value of the '$K_{bch}$', the value of the '$K_I$', and the shortening pattern of at least one of Tables 10 to 43, Tables 46 to 53, Tables 55 and 56, and Tables 58 and 59 above, the zero padding unit 204 pads bits having a value of '0' to corresponding positions, and maps each bit of the information bits to the remnant position. Specifically, the zero padding unit 204 determines the number of groups in which all the bits shall be padded as in Equation (12) as follows.

$$N_{pad} = \left\lfloor \frac{K_{bch} - K_I}{M} \right\rfloor \tag{12}$$

In Equation (12), '$N_{pad}$' denotes the number of groups in which all the bits shall be padded, '$K_{bch}$' denotes the number of BCH information bits, '$K_I$' denotes the number of information bits, and 'M' denotes the number of bits included in a group. For example, if 72 bits are included in a group, M=72.

That is, for $N_{pad}$ groups ($X_{\pi_s(0)}, X_{\pi_s(1)}, \ldots, X_{\pi_s(N_{pad}-1)}$), all bits of the groups are padded with zeros. In other words, the zero padding unit 204 sets, by '0', values of all the bits included in the $N_{pad}$ groups ($X_{\pi_s(0)}, X_{\pi_s(1)}, \ldots, X_{\pi_s(N_{pad}-1)}$) and the zero padding unit 204 pads ($K_{bch}-K_I-M\times N_{pad}$) bits in a group ($X_{\pi_s(N_{pad})}$) additionally. For instance, in the group ($X_{\pi_s(N_{pad})}$), padded bits are the first or the last ($K_{bch}-K_I-M\times N_{pad}$) bits, and the zero padding unit 204 sequentially maps $K_I$ information bits to bit positions which are not padded in BCH information bits. Here, the shortening pattern '$\pi_s(x)$' is a value determined according to a coding rate, a modulation scheme, and a shortening and puncturing rate, and is defined as in at least one of Tables 10 to 43, Tables 46 to 53, Tables 55 and 56, and Tables 58 and 59 above. Practically the shortening pattern described above can be determined and stored in memory in advance. Here, '$X_j$' denotes a $j^{th}$ bit group expressed as in equation (7).

When the number (M) of bits included in one group is greater than or equal to the number of information bits, it is desirable that a degree of a column group of a parity-check matrix corresponding to a group of the last order of shortening is high. Therefore, the group of the last order of shortening is given as $X_{\pi_s(N_{infogroup})} = 0$. In this case, the zero padding unit 204 determines the number ($N_{pad}$) of groups in which all the bits shall be padded as in Equation (13) as follows.

$$\text{If } 0 < K_I \leq M, \; N_{pad} = N_{group} - 1 \tag{13}$$
$$\text{Otherwise}, N_{pad} = \left\lfloor \frac{K_{bch} - K_I}{M} \right\rfloor$$

In Equation (13), '$K_I$' denotes the number of information bits, 'M' denotes the number of bits included in one group, '$N_{pad}$' denotes the number of groups in which all the bits shall be padded, '$N_{infogroup}$' denotes the number of bit groups, and '$K_{bch}$' denotes the number of BCH information bits.

That is, for $N_{pad}$ groups ($X_{\pi_s(0)}, X_{\pi_s(1)}, \ldots, X_{\pi_s(N_{pad}-1)}$), all bits of the groups are padded with zeros. In other words, the zero padding unit 204 sets, by '0', values of all bits included in $N_{pad}$ groups (($X_{\pi_s(0)}, X_{\pi_s(1)}, \ldots, X_{\pi_s(N_{pad}-1)}$). If the '$N_{pad}$' is the identical as the '$N_{group}-1$', the zero padding unit 204 pads (M-$K_I$) information bits in a group ($X_{\pi_s(N_{group}-1)}$) additionally. For example, in the group ($X_{\pi_s(N_{group}-1)}$), padded bits are the first or the last (M-$K_I$) bits. If the '$N_{pad}$' is not the identical as the '$N_{infogroup}-1$', the zero padding unit 204 pads ($K_{bch}-K_I-M\times N_{pad}$) bits in a group ($X_{\pi_s(N_{pad})}$) additionally. For instance, in the group ($X_{\pi_s(N_{pad})}$), padded bits are the first or the last ($K_{bch}-K_I-M\times N_{pad}$) bits. Here, shortening pattern '$\pi_s(x)$' is determined according to a coding rate, a modulation scheme, and a shortening and puncturing rate, and is defined as in at least one of Tables 10 to 43, Tables 46 to 53, Tables 55 and 56, and Tables 58 and 59 above. Here, '$X_j$' denotes a $j^{th}$ bit group expressed as in equation (7) when $A_s=1$.

For the given number ($N_{punc}$) of punctured bits, the puncturing unit 210 determines the number of groups in which all parity bits are punctured as in Equation (14) as follows.

$$N_{punc\_group} = \left\lfloor \frac{N_{punc}}{M} \right\rfloor \text{ for } 0 \leq N_{punc} < N_{ldpc} - K_{ldpc} \tag{14}$$

In Equation (14), '$N_{puncgroup}$' denotes the number of groups in which all parity bits are punctured, '$N_{punc}$' denotes the number of punctured bits, 'M' denotes the number of bits included in one parity bit group, N denotes a length of an LDPC codeword, and '$K_{ldpc}$' denotes a number of an LDPC information bits. For example, if 72 bits are included in a parity bits group, M=72.

The puncturing unit 210 punctures all parity bits in $N_{puncgroup}$ parity bit groups ($P_{\pi_p(0)}, P_{\pi_p(1)}, \ldots, P_{\pi_p(N_{puncgroup}-1)}$), and the puncturing unit 210 punctures ($N_{punc}-M\times N_{puncgroup}$) parity bits in the group ($P_{\pi_p(N_{puncgroup})}$) additionally. For instance, in the group ($P_{\pi_p(N_{puncgroup})}$), punctured bits are the first or last ($N_{punc}-M\times N_{puncgroup}$) bits. Here, puncturing pattern, '$\pi_p(x)$' is determined according to a coding rate, a codeword length, a modulation scheme, a puncturing and shortening rate, and is defined as in at least one of Tables 10 to 43, Tables 46 to 53, Tables 55 and 56, and Tables 58 and 59 above. Practically, the puncturing pattern described above can be determined and stored in memory in advance. Here, '$P_j$' denotes a $j^{th}$ parity bit group expressed as in equation (8) or (10) when $A_p=1$.

Also, the puncturing unit 210 can remove padded bits in the zero padding unit 204. Although a description has been made herein considering all of shortening and puncturing, the shortening and puncturing may alternatively be independently performed.

Figure 6:
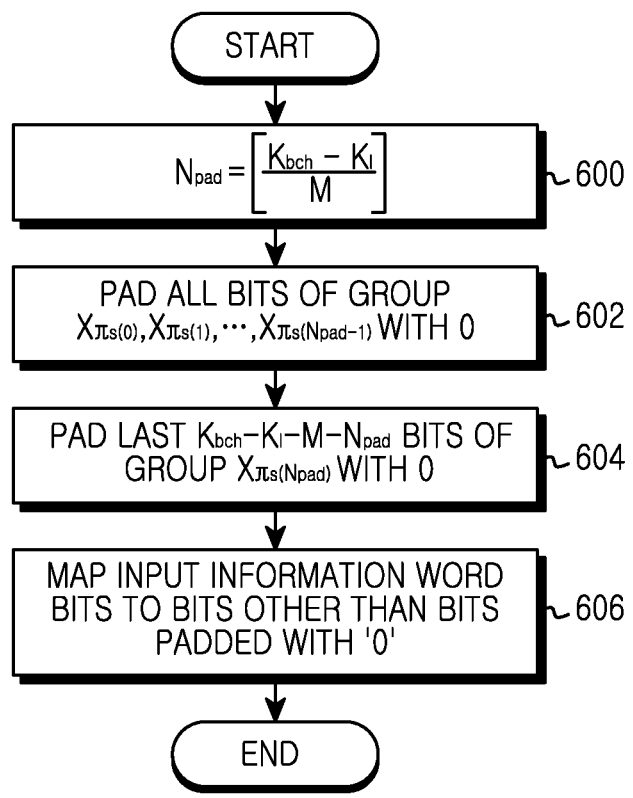
FIG. 6 illustrates a padding procedure in a communication/broadcasting system according to an embodiment of the present invention.

FIG. 6 illustrates a padding procedure in a communication/broadcasting system according to an embodiment of the present invention.

In step 600, the system obtains $N_{pad}$ as in Equation 12. '$N_{pad}$' is the number of bit groups in which all bits are padded. The 'M' value is given as 'M=72' when a LDPC codeword length ($N_{ldpc}$) is equal to '4320', and 'M' is given as 'M=360' when the '$N_{ldpc}$' is equal to '16200'. In step 602, the system pads all bits of the $N_{pad}$ bit group (($X_{\pi_s(0)}, X_{\pi_s(1)}, \ldots, X_{\pi_s(N_{pad}-1)}$) with zeros. The '$\pi_s(x)$' is an index value of an bit group defined in at least one of Tables 10 to 43, Tables 46 to 53, Tables 55 and 56, and Tables 58 and 59 above, and is varied according to a coding rate, a modulation scheme, and a puncturing and shortening rate. In step 604, the system pads ($K_{bch}-K_I-M\times N_{pad}$) bits in the last bit of bit group $X_{\pi^s(N_{pad})}$ with zeros additionally. Alternatively, the system can pad ($K_{bch}-K_I-M\times N_{pad}$) bits from the first bit of bit group $X_{\pi_s(N_{pad})}$ with zeros additionally. Step 604 can be omitted according to the number of bits to be padded. For instance, when the bits of the ($K_{bch}-K_I-M\times N_{pad}$) number are equal to '0', that is, when the number of bits to be padded is equal to a multiple of 'M', additional padding of step 604 can be omitted. In step 606, the system maps information bits to bit positions which are not padded.

For instance, when '$N_{ldpc}$' is equal to '4320', the 'R' is equal to '¼', the 'A' is equal to '7/4', the 'B' is equal to '0', and a BPSK modulation scheme is used, the number of bit groups is equal to '15' and the number of bits within one group is equal to '72'. Assume that the number of input bits is given as $K_I=300$, $S=[s_0, s_1, \ldots, s_{299}]$ is given, and the number of BCH information bits is given as $K_{bch}=980$. By step 600, $$N_{pad} = \left\lfloor \frac{980-300}{72} \right\rfloor = 9$$

is given. By step 602, the system pads all bits of nine bit groups $(X_{\pi_s(0)}, X_{\pi_s(1)}, X_{\pi_s(2)}, X_{\pi_s(3)}, X_{\pi_s(4)}, X_{\pi_s(5)}, X_{\pi_s(6)}, X_{\pi_s(7)}, X_{\pi_s(8)})$, i.e., $(X_{11}, X_{10}, X_9, X_8, X_7, X_6, X_5, X_4, X_3)$. By step 604, the system pads '0' to the last bits of $X_{\pi_s(9)}$ to bits of $K_{bch} - K_I - M \times N_{pad} = 980 - 300 - 72 \times 9 = 32$ number. By step 606, the system maps the $S=[s_0, s_1, \ldots, s_{299}]$ to bit positions which are not padded.

Figure 7A:
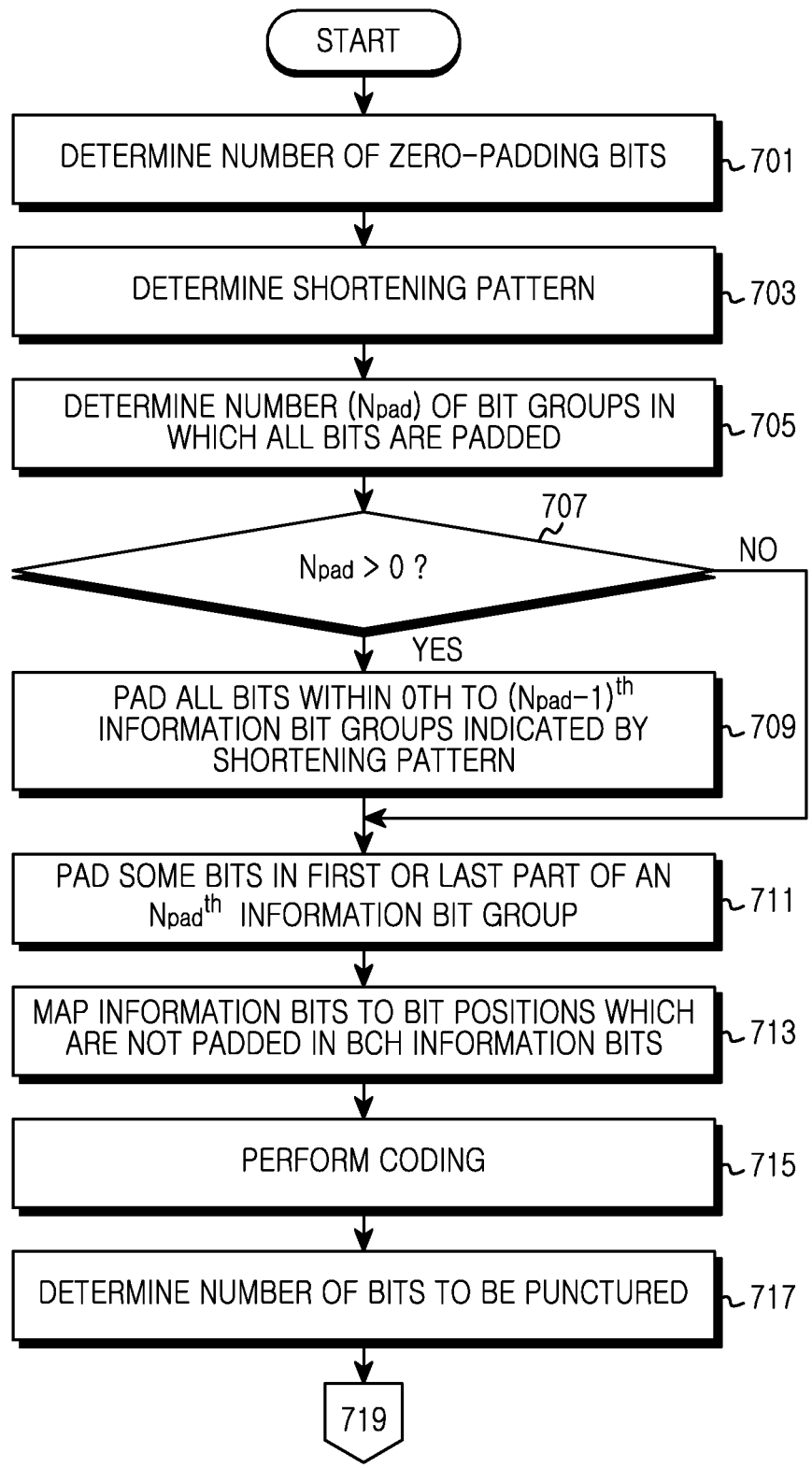
FIGS. 7A and 7B illustrate an operation procedure of a transmitter in a communication/broadcasting system according to an embodiment of the present invention.
Figure 7B:
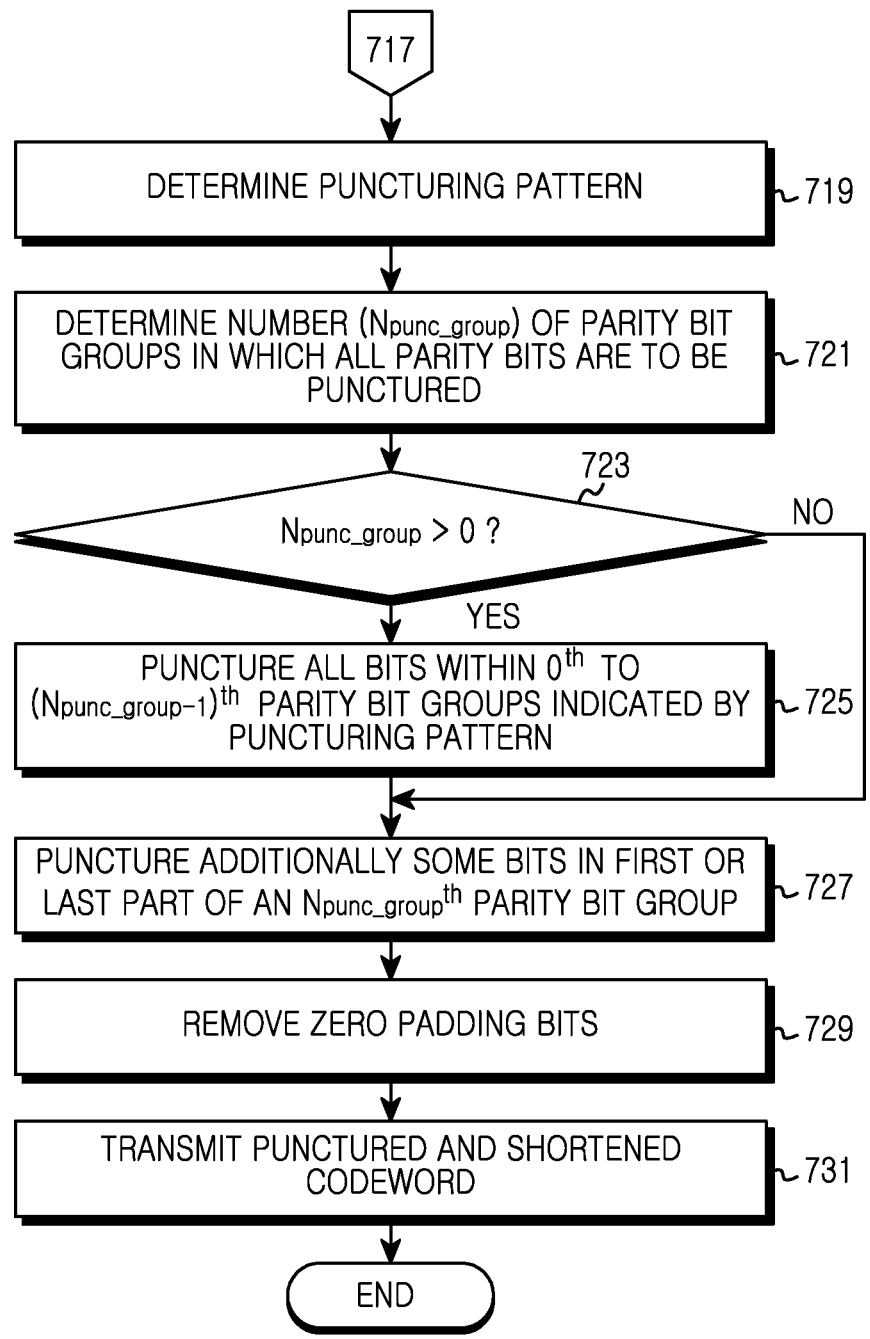

FIGS. 7A and 7B illustrate an operation procedure of a transmitter in a communication/broadcasting system according to an embodiment of the present invention.

Referring to FIGS. 7A and 7B, in step 701, the transmitter determines the number of zero-padding bits when the number of input bits for coding, that is the number of BCH information bits is greater than the number of provided information bits. That is, by subtracting the number of information bits from the number of BCH information bits, that is input bits for the coding, the transmitter determines the number of zero-padding bits.

Next, the transmitter proceeds to step 703 and determines a shortening pattern to be applied. That is, the transmitter has stored at least one shortening pattern, from which it selects a shortening pattern corresponding to a present condition. For example, the shortening pattern is defined according to a codeword length, a coding rate, a shortening and puncturing rate, or a modulation scheme. For instance, at least one shortening pattern is defined in a unit of bit group dividing information bits in a pre-defined unit, and may include at least one of Table 10, Table 12, Table 14, Table 16, Table 18, Table 20, Table 22, Table 24, Table 26, Table 28, Table 30, Table 32, Table 34, Table 36, Table 38, Table 40, Table 42, Table 46, Table 48, Table 50, Table 52, Table 55, and Table 58 above. Alternatively, transmitter generate shortening pattern based on the present condition without pre-storing. The generated shortening pattern may be at least one of Table 10, Table 12, Table 14, Table 16, Table 18, Table 20, Table 22, Table 24, Table 26, Table 28, Table 30, Table 32, Table 34, Table 36, Table 38, Table 40, Table 42, Table 46, Table 48, Table 50, Table 52, Table 55, and Table 58 above.

After determining the shortening pattern, the transmitter proceeds to step 705 and determines the number $(N_{pad})$ of bit groups in which all the bits are padded with zeros. That is, the transmitter divides the number of bits to be padded by the number of bits per group and determines, as the '$N_{pad}$', a maximum integer value less than the division result. If the number of the information bits is less than the number of bits per group, all the information bits are included in one bit group. Accordingly, '$N_{pad}$' is less '1' than the number of the whole bit groups.

The transmitter then proceeds to step 707 and determines whether '$N_{pad}$' is greater than '0'. In other words, the transmitter determines whether at least one bit group in which all the bits are padded with zeros exists. If '$N_{pad}$' is less than or equal to '0', the transmitter jumps to step 711 and omits step 709.

In contrast, if '$N_{pad}$' is greater than '0', the transmitter proceeds to step 709 and pads all bits within $0^{th}$ to $(N_{pad}-1)^{th}$ bit groups indicated by the shortening pattern determined in step 703 with zeros. Next, the transmitter proceeds to step 711 and pads some bits in the first or last part of an $N_{pad}^{th}$ bit group with zeros. However, when the number of bits to be padded is an integer multiple of the number of bits per group, step 711 is omitted and the transmitter proceeds to step 713 and maps information bits to bit positions which are not padded in BCH information bits. That is, the transmitter pads bits to bit groups according to order indicated by the shortening pattern, and maps the information bits to the remnant bits' position.

After that, the transmitter proceeds to step 715 and performs coding for BCH information bits. The transmitter can perform a concatenated coding techniques. For example, the transmitter can successively perform BCH coding and LDPC coding. In this case, the transmitter can perform BCH coding for the BCH information bits, and perform LDPC coding for LDPC information bits, that is a BCH codeword generated as the BCH coding result. According to another embodiment of the present invention, the transmitter can perform only LDPC coding for the BCH information bits. If only LDPC coding is performed without BCH coding, the BCH information bits may be named the LDPC information bits.

After performing the coding, the transmitter proceeds to step 717 and determines the number of bits to be punctured according to a value related to coding rate and the number of shortened bits, in other words, a puncturing and shortening rate. For example, the value related to coding rate and the number of shortened bits, in other words, the puncturing and shortening rate is defined as in Equation 11 above.

After determining the number of bits to be punctured, the transmitter proceeds to step 719 and determines a puncturing pattern to be applied. That is, the transmitter has stored a predefined at least one puncturing pattern, from which it selects a puncturing pattern corresponding to a present condition. For example, the puncturing pattern is defined according to a codeword length, a coding rate, a puncturing and puncturing rate, or a modulation scheme. For instance, at least one puncturing pattern is defined an order of groups into which information bits of the codeword are divided and include a pre-defined number of bits. For example, the at least one puncturing pattern can include at least one of Table 11, Table 13, Table 15, Table 17, Table 19, Table 21, Table 23, Table 25, Table 27, Table 29, Table 31, Table 33, Table 35, Table 37, Table 39, Table 41, Table 43, Table 47, Table 49, Table 51, Table 53, Table 56, and Table 59 above. Alternatively, transmitter generate puncturing pattern based on the present condition without pre-storing. The generated puncturing pattern may be at least one of Table 10, Table 12, Table 14, Table 16, Table 18, Table 20, Table 22, Table 24, Table 26, Table 28, Table 30, Table 32, Table 34, Table 36, Table 38, Table 40, Table 42, Table 46, Table 48, Table 50, Table 52, Table 55, and Table 58 above.

After determining the puncturing pattern, the transmitter proceeds to step 721 and determines the number $(N_{punc\_group})$ of parity bit groups in which all parity bits are to be punctured. That is, the transmitter divides the number of bits to be punctured by the number of bits per group and determines, as '$N_{punc\_group}$', a maximum integer value less than the division result. If the number of bits not to be punctured is less than the number of bits included in one parity bit group, the bits not to be punctured are all included in one parity bit group. Accordingly, '$N_{punc\_group}$' is less '1' than the number of the parity bit groups.

After that, the transmitter proceeds to step 723 and determines whether '$N_{punc\_group}$' is greater than '0'. In other words, the transmitter determines whether at least one parity bit group in which the all bits are to be punctured exists. If the '$N_{punc\_group}$' is less than or equal to '0', the transmitter jumps to step 727 and omits step 725.

In contrast, if '$N_{punc\_group}$' is greater than '0', the transmitter proceeds to step 725 and punctures all bits within $0^{th}$ to $(N_{punc\_group}-1)^{th}$ parity bit groups indicated by the puncturing pattern determined in step 719. The transmitter then proceeds to step 727 and punctures additionally some bits in the first or last part of an $N_{punc\_goup}^{th}$ parity bit group. That is, the transmitter punctures bits within parity bit groups according to order indicated by the puncturing pattern through steps 725 and 727. However, when the number of bits to be punctured is an integer multiple of the number of bits per group, step 727 is omitted.

Next, the transmitter proceeds to step 729 and removes the zero padding bits. In other words, the transmitter removes the zero-padding bits padded in steps 709 and 711. After that, the transmitter proceeds to step 731 and transmits a punctured and shortened codeword.

Figure 8A:
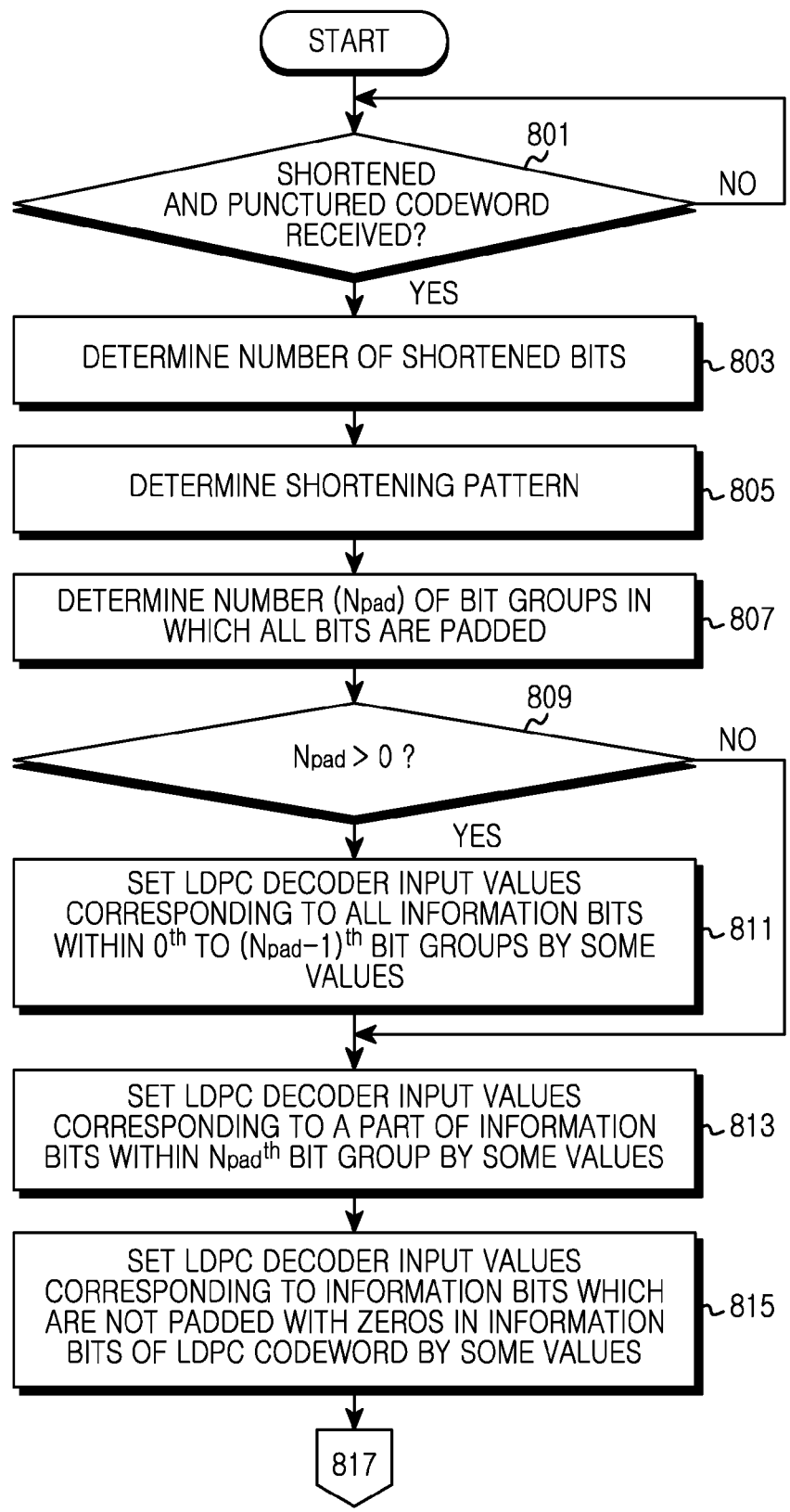
FIGS. 8A and 8B illustrate an operation procedure of a receiver in a communication/broadcasting system according to an embodiment of the present invention.
Figure 8B:
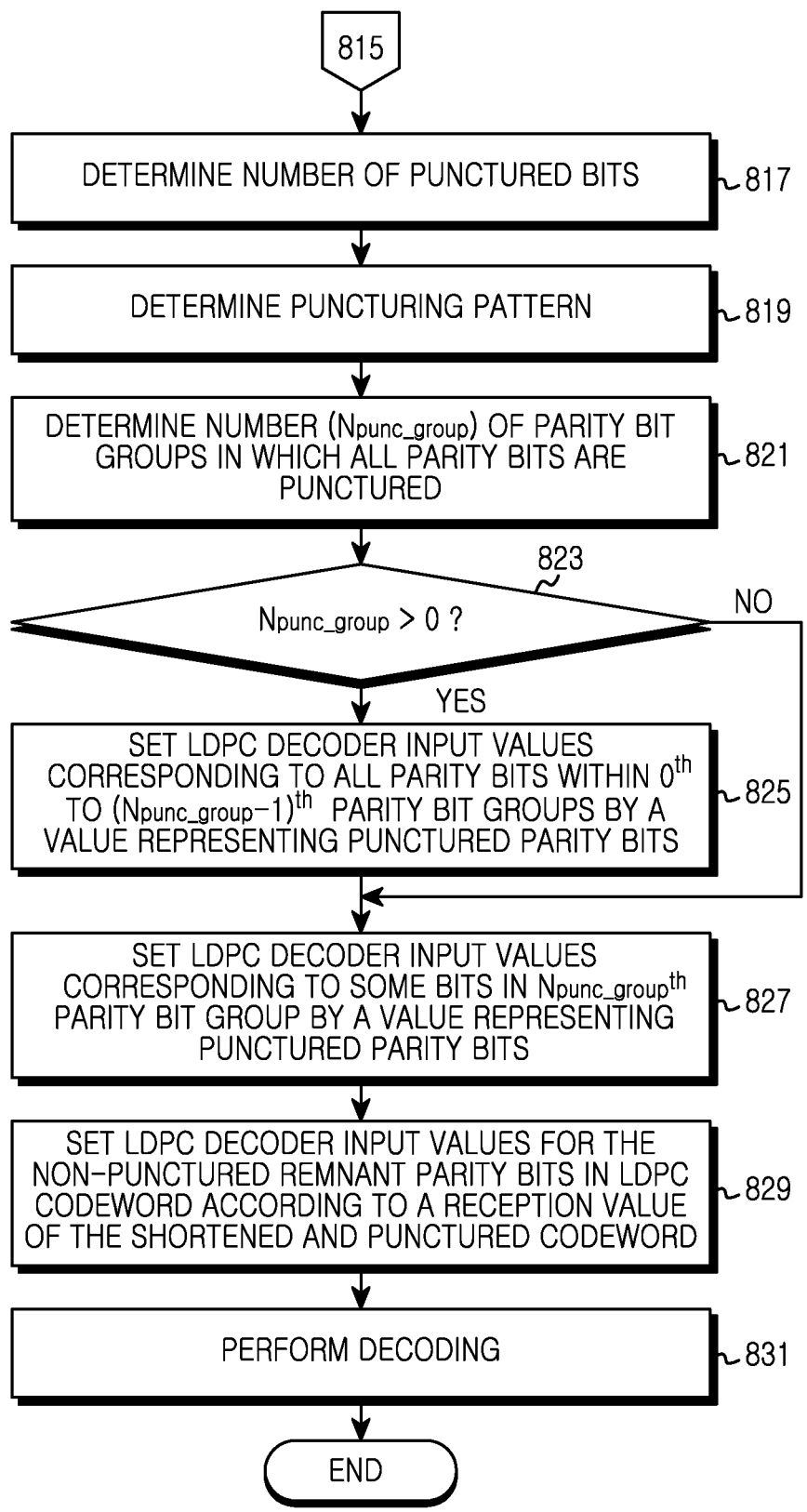

FIGS. 8A and 8B illustrate an operation procedure of a receiver in a communication/broadcasting system according to an embodiment of the present invention.

Referring to FIGS. 8A and 8B, in step 801, the receiver determines whether a shortened and punctured codeword is received.

If it is determined in step 801 that the shortened and punctured codeword is received, the receiver proceeds to step 803 and determines the number of shortened bits. The shortening occurs when the number of input bits for coding is greater than the number of information bits. That is, by subtracting the provided number of bits of a received information bits in the shortened and punctured codeword from the number of bits of an information bits in a LDPC codeword, In other words, the receiver determines the number of zero-padded bits.

Next, the receiver proceeds to step 805 and determines a shortening pattern to be applied. That is, the receiver has stored a predefined at least one shortening pattern and, of the stored at least one shortening pattern, selects a shortening pattern corresponding to a present condition. For example, the shortening pattern is defined according to a codeword length, a coding rate, a shortening and puncturing rate, or a modulation scheme. At least one shortening pattern is defined as an order of groups into which information bits of the codeword are divided and include bits of a pre-defined number. For example, the at least one shortening pattern can include at least one of Table 10, Table 12, Table 14, Table 16, Table 18, Table 20, Table 22, Table 24, Table 26, Table 28, Table 30, Table 32, Table 34, Table 36, Table 38, Table 40, Table 42, Table 46, Table 48, Table 50, Table 52, Table 55, and Table 58 above. Alternatively, receiver generate shortening pattern based on the present condition without pre-storing. The generated shortening pattern may be at least one of Table 10, Table 12, Table 14, Table 16, Table 18, Table 20, Table 22, Table 24, Table 26, Table 28, Table 30, Table 32, Table 34, Table 36, Table 38, Table 40, Table 42, Table 46, Table 48, Table 50, Table 52, Table 55, and Table 58 above. The information about present condition related to codeword length, the coding rate, the shortening and the puncturing rate can be received from the transmitter. According to another embodiment of the present invention, the receiver can use a shortening pattern indicated from a transmitter through separate signaling.

After determining the shortening pattern, the receiver proceeds to step 807 and determines the number ($N_{pad}$) of bit groups in which all bits are padded with zeros in the transmitter. That is, the receiver divides the number of bits to be padded by the number of bits per group and determines, as the '$N_{pad}$', a maximum integer value less than the division result. If the number of the received information bits in the shortened and punctured codeword is less than the number of bits included in one bit group, the received information bits in the shortened and punctured codeword are all included in one bit group. Accordingly, '$N_{pad}$' is less '1' than the number of the whole bit groups.

Next, the receiver proceeds to step 809 and determines whether the '$N_{pad}$' is greater than '0'. In other words, the receiver determines whether at least one bit group in which all bits are padded with zeros exists. If the '$N_{pad}$' is not greater than '0', the receiver jumps to step 813 and omits step 811.

In contrast, if '$N_{pad}$' is greater than '0', LDPC decoder input values corresponding shortened LDPC information bits are set by some values that represent shortened LDPC information bits. For example, if LDPC decoder input values are based on LLR (Log Likelihood Ratio), above some value is plus or minus infinite.

the receiver proceeds to step 811 and sets LDPC decoder input values corresponding to all information bits within $0^{th}$ to $(N_{pad}-1)^{th}$ bitgroups indicated by the shortening pattern determined in step 805 by some values which represent shortened LDPC information bits which is shortened in the transmitter.

Next, the receiver proceeds to step 813 and sets LDPC decoder input values corresponding some bits in the first or last part of an $N_{pad}^{th}$ bit group by some values which represent shortened LDPC information bits which is shortened in the transmitter. The receiver proceeds to step 815 and sets LDPC decoder input values corresponding to information bits which are not padded with zeros in information bits of LDPC codeword by some values based on the received shortened and punctured codeword. For example, when LDPC codeword, that is the decoding input value is a Log Likelihood Ratio (LLR) value, the value representing the 0-bit indicates an LLR value for when a probability that it will be '0' is equal to '1' and a probability that it will be '1' is equal to '0'. That is, through step 811 to step 815, the receiver restores an information bits of the LDPC codeword that is generated through coding in the transmitter.

After that, the receiver proceeds to step 817 and determines the number of punctured bits according to a value related to coding rate and the number of shortened bits, in other words, a puncturing and shortening rate. For example, the value related to coding rate and the number of shortened bits, in other words, the puncturing and shortening rate is defined as in Equation 11 above.

After determining the number of punctured bits, the receiver proceeds to step 819 and determines a puncturing pattern to be applied. That is, the receiver has stored a predefined at least one puncturing pattern from which it selects a puncturing pattern corresponding to a present condition. For example, the puncturing pattern is defined according to a codeword length, a coding rate, a puncturing and puncturing rate, or a modulation scheme. At least one puncturing pattern is defined as an order of groups that parity bits of the codeword is divided into and include a pre-defined number of bits. The at least one puncturing pattern can include at least one of Table 11, Table 13, Table 15, Table 17, Table 19, Table 21, Table 23, Table 25, Table 27, Table 29, Table 31, Table 33, Table 35, Table 37, Table 39, Table 41, Table 43, Table 47, Table 49, Table 51, Table 53, Table 56, and Table 59 above. Alternatively, receiver generate puncturing pattern based on the present condition without pre-storing. The generated puncturing pattern may be at least one of Table 10, Table 12, Table 14, Table 16, Table 18, Table 20, Table 22, Table 24, Table 26, Table 28, Table 30, Table 32, Table 34, Table 36, Table 38, Table 40, Table 42, Table 46, Table 48, Table 50, Table 52, Table 55, and Table 58 above. The information about present condition related to codeword length, the coding rate, the shortening and the puncturing rate can be received from the transmitter. According to another embodiment of the present invention, the receiver can use a puncturing pattern indicated from a transmitter through separate signaling.

After determining the puncturing pattern, the receiver proceeds to step 821 and determines the number ($N_{punc\_group}$) of parity bit groups in which all parity bits are punctured. That is, the receiver divides the number of punctured bits by the number of bits per group and determines, as '$N_{punc\_group}$', a maximum integer value less than the division result. If the number of the received parity bits is less than the number of bits included in one parity bit group, the received parity bits are all included in one parity bit group. Accordingly, '$N_{punc\_group}$' is a value less '1' than the number of the whole parity bit groups.

Next, the receiver proceeds to step 823 and determines whether '$N_{punc\_group}$' is greater than '0'. In other words, the receiver determines whether at least one parity bit group in which all bits are punctured exists. If '$N_{punc\_group}$' is not greater than '0', the receiver jumps to step 827 with omitting step 825.

In contrast, if '$N_{punc\_group}$' is greater than '0', the receiver proceeds to step 825 and sets, by a value representing punctured parity bits, LDPC decoder input values corresponding to all parity bits within $0^{th}$ to $(N_{punc\_group}-1)^{th}$ parity bit groups in the LDPC codeword indicated by the puncturing pattern determined in step 819. The value representing punctured parity bits can be a value in which a probability that parity bits is '0' and a probability that parity bits is '1' are identical as each other Next, the receiver proceeds to step 827 and sets, by a value representing punctured parity bits, LDPC decoder input values corresponding to some bits in the first or last part of an $N_{punc\_group}{}^{th}$ parity bit group in the LDPC codeword. The receiver proceeds to step 829 and sets LDPC decoder input values for the non-punctured remnant parity bits in LDPC codeword according to reception values of the shortened and punctured codeword. That is, through step 825 to step 829, the receiver restores parity bits of the LDPC codeword that is generated through coding in the transmitter. The value representing punctured parity bits can be a value in which a probability that parity bits is '0' and a probability that parity bits is '1' are identical as each other.

The receiver proceeds to step 831 and performs decoding for the restored codeword. The receiver can perform a combination of a plurality of decoding techniques. For example, the receiver can successively perform LDPC decoding and BCH decoding. The receiver can perform LDPC decoding for the restored LDPC codeword, and perform BCH decoding for an LDPC information bits generated as the LDPC decoding result. According to another embodiment of the present invention, the receiver can perform only LDPC decoding for the restored LDPC codeword.

Figure 9:
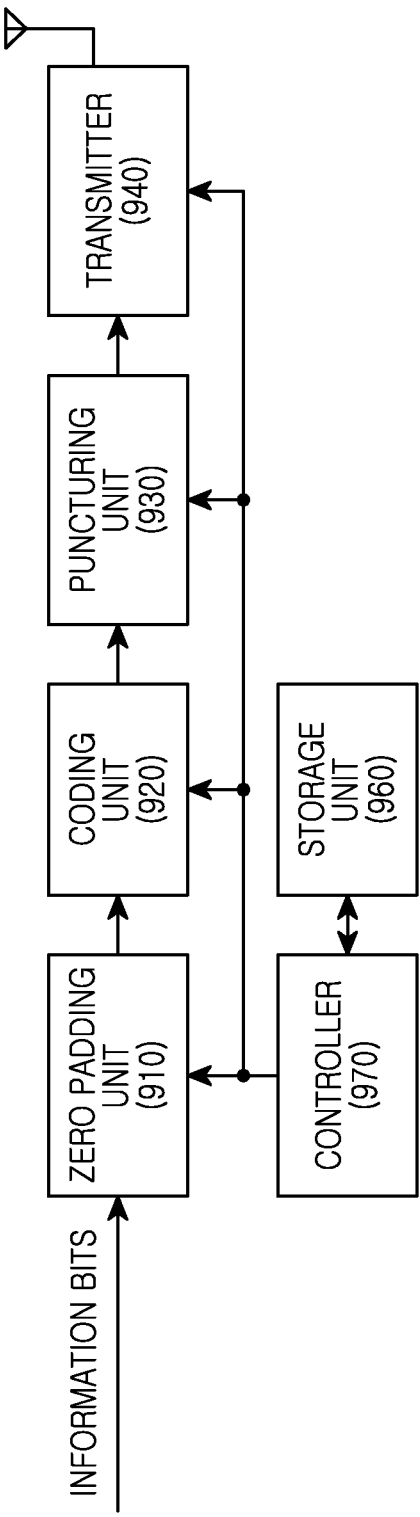
FIG. 9 illustrates a construction of a transmitter in a communication/broadcasting system according to an embodiment of the present invention.

FIG. 9 illustrates a construction of a transmitter in a communication/broadcasting system according to an embodiment of the present invention.

As illustrated in FIG. 9, the transmitter includes a zero (0) padding unit 910, a coding unit 920, a puncturing unit 930, a transmitter 940, a storage unit 960, and a controller 970.

By padding bits with zeros to information bits, the zero padding unit 910 generates BCH information bits which is input to the coding unit 920. The zero padding unit 910 determines the number of bits to be padded with zeros using information provided from the controller 970, and pads bits with zeros according to shortening pattern information provided from the controller 970. That is, the zero padding unit 910 pads bits to bit groups according to order indicated by the shortening pattern, and maps the information bits to the remnant bits' position.

The zero padding unit 910 can determine the number ($N_{pad}$) of bit groups in which all the bits are padded with zeros. Alternatively, the number ($N_{pad}$) of bit groups in which all the bits are padded with zeros can be determined by the controller 970.

Specifically, the zero padding unit 910 pads all bits within $0^{th}$ to $(N_{pad}-1)^{th}$ bit groups indicated by the shortening pattern and then pads some bits in the first or last part of an $N_{pad}{}^{th}$ bit group with zeros The zero padding unit 910 maps information bits to bit positions which are not padded in BCH information bits.

The coding unit 920 performs coding for BCH information bits padded by the zero padding unit 910. The coding unit 920 is filled with one coding block, or can have a structure in which a plurality of coding blocks is concatenated. For example, although not illustrated, the coding unit 920 can include the BCH coder and LDPC coder. In this case, the BCH coder performs BCH coding for BCH information bits, and the LDPC coder can perform LDPC coding for LDPC information bits, that is a BCH codeword generated as the BCH coding result. According to another embodiment of the present invention, the coding unit 920 can perform only LDPC coding for the BCH information bits. If only LDPC coding is performed without BCH coding, the BCH information bits may be named the LDPC information bits. Alternatively, besides the coding unit 920, another coder (not shown) is added in front of the zero padding unit 910. For example, the coding unit 920 performs the LDPC coding, and another coder (not shown) positioned in front of the zero padding unit 910 can perform the BCH coding.

By puncturing some bits in a parity of a LDPC codeword generated by the coding unit 920, the puncturing unit 930 converts the parity of the LDPC codeword output from the coding unit 920 into parity bits to be transmitted. The puncturing unit 930 determines the number of bits to be punctured according to a value related to coding rate and the number of shortened bits, in other words, a puncturing and shortening rate provided from the controller 970, and punctures bits of a position according to puncturing pattern information provided from the controller 970. That is, the puncturing unit 930 punctures bits within parity bit groups according to order indicated by the puncturing pattern.

For example, the value related to coding rate and the number of shortened bits, in other words, the puncturing and shortening rate is defined as in Equation 11 above. The puncturing unit 930 determines the number ($N_{punc\_group}$) of parity bit groups in which all parity bits are to be punctured, punctures all parity bits within $0^{th}$ to $(N_{punc\_group}-1)^{th}$ parity bit groups indicated by the puncturing pattern, and then punctures some bits in the first or last part of an $N_{punc\_group}{}^{th}$ parity bit group. By removing zero-padded bits padded by the zero padding unit 910, the puncturing unit 930 can convert an information bits of the LDPC codeword from the coding unit 920 into a information bits in a shortened and punctured codeword to be transmitted. The puncturing unit 930 is also denoted as a 'zero removing and puncturing unit'.

When a function of removing the zero-padded bits is excluded, even the zero padding unit 910 is omitted. That is, instead of generating BCH information bits for the coding unit 920 by padding the bits in the zero padding unit 910, a column corresponding to the bit to be padded is removed in a parity-check matrix used in the coding unit 920. By removing the column corresponding to the bit to be padded, the identical result is obtained despite the absence of a process of padding. The transmitter 940 modulates and Radio Frequency (RF)-processes the shortened and punctured codeword and then transmits the shortened and punctured codeword through an antenna.

The storage unit 960 stores configuration information, a command and the like for operation of the transmitter. Particularly, the storage unit 960 stores at least one shortening pattern defined in unit of bit group and at least one puncturing pattern defined in unit of parity bit group. For instance, the shortening pattern and the puncturing pattern are defined according to a codeword length, a coding rate, a shortening and puncturing rate, or a modulation scheme. The at least one shortening pattern can include at least one of Table 10, Table 12, Table 14, Table 16, Table 18, Table 20, Table 22, Table 24, Table 26, Table 28, Table 30, Table 32, Table 34, Table 36, Table 38, Table 40, Table 42, Table 46, Table 48, Table 50, Table 52, Table 55, and Table 58 above. The at least one puncturing pattern can include at least one of Table 11, Table 13, Table 15, Table 17, Table 19, Table 21, Table 23, Table 25, Table 27, Table 29, Table 31, Table 33, Table 35, Table 37, Table 39, Table 41, Table 43, Table 47, Table 49, Table 51, Table 53, Table 56, and Table 59 above.

The controller 970 controls the general functions of the transmitter. Particularly, the controller 970 provides such information as information bits' length, a length of information bits required in the coding unit 920, and shortening pattern information, to the zero padding unit. The controller 970 provides a parity-check matrix to the coding unit 920, and puncturing pattern information to the puncturing unit 930. The controller 970 provides information capable of determining positions of bits to be padded, to the zero padding unit 910. In FIG. 9, the zero padding unit 910 determines padding positions of bits, and pads the bits with zeros. Alternatively, the controller 970 can determine the padding positions of the bits, and the zero padding unit 910 can pad the bits with zeros as indicated by the controller 970.

In FIG. 9, the puncturing unit 930 determines a position of a punctured bit, and performs puncturing. Alternatively, the controller 970 can determine the position of the punctured bit, and the puncturing unit 930 can perform puncturing as indicated by the controller 970.

Figure 10:
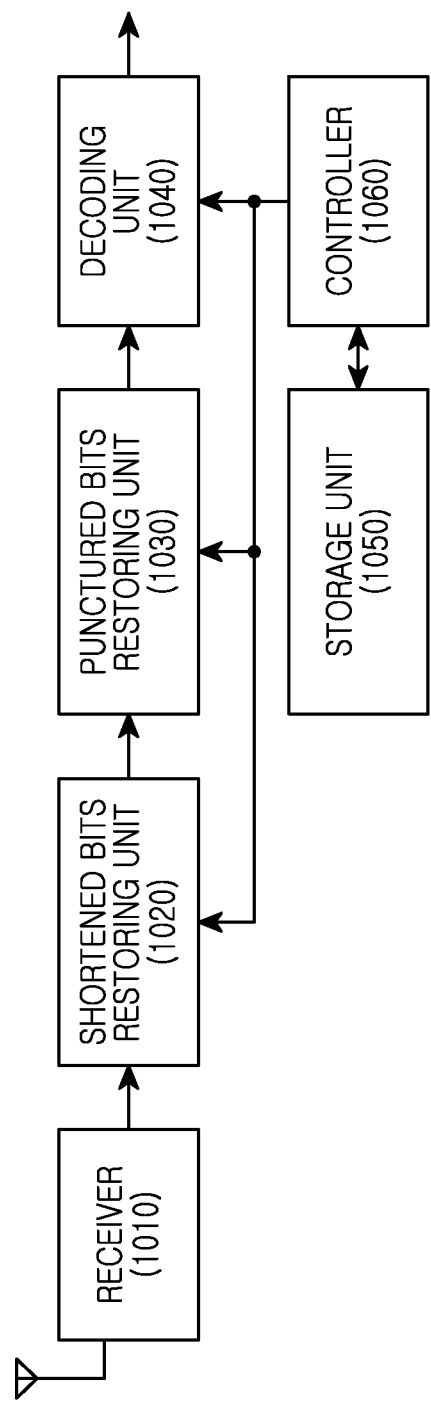
FIG. 10 illustrates a construction of a receiver in a communication/broadcasting system according to an embodiment of the present invention.

FIG. 10 illustrates a construction of a receiver in a communication/broadcasting system according to an embodiment of the present invention.

Referring to FIG. 10, the receiver includes a receiver 1010, a shortened bits restoring unit 1020, a punctured bits restoring unit 1030, a decoding unit 1040, a storage unit 1050, and a controller 1060.

The receiver 1010 receives a shortened and punctured codeword transmitted in a transmitter. That is, the receiver 1010 RF-processes a receive signal, and performs demodulation, thereby determining a reception value of the shortened and punctured codeword.

By setting LDPC decoder input values by some values which represent shortened LDPC information bits which is shortened in the transmitter, the shortened bits restoring unit 1020 restores an information bits in the received, shortened and punctured codeword generated through coding in a transmitter. Specifically, the shortened bits restoring unit 1020 determines the number of shortened bits, identifies a shortening pattern provided from the controller 1060, and then determines the number ($N_{pad}$) of parity bit groups in which all bits are padded with zeros. The shortened bits restoring unit 1020 sets LDPC decoder input values corresponding all information bits within $0^{th}$ to ($N_{pad}-1)^{th}$ bit groups indicated by the shortening pattern by some values which represent shortened LDPC information bits and sets LDPC decoder input values corresponding some bits in the first or last part of an $N_{pad}^{th}$ bit group by some values which represent shortened LDPC information bits. The values representing shortened LDPC information bits can be plus or minus infinite, if LDPC decoder input values are based on LLR (Log Likelihood Ratio).

The shortened bits restoring unit 1020 sets LDPC decoder input values corresponding information bits which are not padded with zeros in information bits of LDPC codeword by some values based on the received shortened and punctured codeword.

The punctured bits restoring unit 1030 sets LDPC decoder input values by a value representing punctured parity bits, thereby restoring parity generated through coding in a transmitter. Specifically, the punctured bits restoring unit 1030 determines the number of punctured bits according to a value related to coding rate and the number of shortened bits, in other words, a puncturing and shortening rate. For example, the value related to coding rate and the number of shortened bits, in other words, the puncturing and shortening rate is defined as in Equation 11 above. The punctured bits restoring unit 1030 determines the number ($N_{punc\_group}$) of parity bit groups in which all bits are punctured, and sets, by a value representing punctured parity bits, LDPC decoder input values corresponding to all parity bits within $0^{th}$ to ($N_{punc\_group}-1)^{th}$ parity bit groups in the LDPC codeword provided from the controller 1060. The punctured bits restoring unit 1030 sets, by a value representing punctured parity bits, LDPC decoder input values corresponding to some bits in the first or last part of an $N_{punc\_group}^{th}$ parity bit group in the LDPC codeword. The value representing punctured parity bits can be a value in which a probability that parity bits is '0' and a probability that parity bits is '1' are identical as each other.

The punctured bits restoring unit 1030 sets a LDPC decoder input values for the non-punctured remnant parity bits in LDPC codeword according to a reception value of the shortened and punctured codeword The decoding unit 1040 performs decoding for a LDPC codeword restored by the shortened bits restoring unit 1020 and the punctured bits restoring unit 1030. The decoding unit 1040 can have a structure in which a plurality of decoding blocks are combined. For example, although not illustrated, the decoding unit 1040 can include an LDPC decoder and a BCH decoder. The LDPC decoder can perform LDPC decoding for the restored LDPC codeword, and the BCH decoder can perform BCH decoding for an LDPC information bits generated as the LDPC decoding result. According to another embodiment of the present invention, the decoding unit 1040 can perform only LDPC decoding for the restored LDPC codeword.

The storage unit 1050 stores configuration information, a command and the like for operation of the receiver. Particularly, the storage unit 1050 stores at least one shortening pattern defined in unit of bit group and at least one puncturing pattern defined in unit of parity bit group. For instance, the shortening pattern and the puncturing pattern are defined according to a codeword length, a coding rate, a shortening and puncturing rate, or a modulation scheme. The at least one shortening pattern can include at least one of Table 10, Table 12, Table 14, Table 16, Table 18, Table 20, Table 22, Table 24, Table 26, Table 28, Table 30, Table 32, Table 34, Table 36, Table 38, Table 40, Table 42, Table 46, Table 48, Table 50, Table 52, Table 55, and Table 58 above. The at least one puncturing pattern can include at least one of Table 11, Table 13, Table 15, Table 17, Table 19, Table 21, Table 23, Table 25, Table 27, Table 29, Table 31, Table 33, Table 35, Table 37, Table 39, Table 41, Table 43, Table 47, Table 49, Table 51, Table 53, Table 56, and Table 59 above.

The controller 1060 controls the general functions of the receiver, such as providing to the shortened bits restoring unit 1020 an information bits' length, a length of information bits required in the decoding unit 1040, and shortening pattern information. The controller 1060 provides a parity-check matrix to the decoding unit 1040 and puncturing pattern information to the punctured bits restoring unit 1030. In FIG. 10, the shortened bits restoring unit 1020 determines padding positions of bits, and pads the bits with zeros. Alternatively, the controller 1060 can determine the padding positions of the bits, and the shortened bits restoring unit 1020 can pad the bits with zeros as indicated by the controller 1060. The punctured bits restoring unit 1030 may determine a position of a punctured bit, and performs puncturing. However, the controller 1060 can also determine the position of the punctured bit, and the punctured bits restoring unit 1030 can restore a punctured value as indicated by the controller 1060.

Embodiments of the present invention can code and decode information bit streams of various lengths and simultaneously maintain the optimal performance, by grouping columns considering a characteristic of a parity-check matrix and performing shortening and puncturing in a unit of bit group corresponding to each column group.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for an operation of a transmitter, the method comprising:
   Low Density Parity Check (LDPC)-encoding LDPC information bits to generate a codeword;
   determining a number ($N_{punc}$) of bits to be punctured in parity bits of the codeword;
   determining a number ($N_{punc\_group}$) of parity bit groups in which all bits are punctured; and
   puncturing the all bits within $0^{th}$ to $(N_{punc\_group}-1)^{th}$ parity bit groups indicated by a puncturing pattern to create a punctured codeword,
   wherein the puncturing pattern is defined as an order of the parity bit groups defined as 29, 45, 43, 27, 32, 35, 40, 38, 0, 19, 8, 16, 41, 4, 26, 36, 30, 2, 13, 42, 46, 24, 37, 1, 33, 11, 44, 28, 20, 9, 34, 3, 17, 6, 21, 14, 23, 7, 22, 47, 5, 10, 12, 15, 18, 25, 31 and 39.

2. The method of claim 1, wherein each of the parity bit groups includes a pre-defined number of bits which is a divisor of an interval in which a pattern of a column is repeated in a parity part matrix of the parity check matrix.

3. The method of claim 1, further comprising:
   puncturing one or more bits in an $N_{punc\_group}{}^{th}$ parity bit group additionally.

4. The method of claim 1, further comprising:
   transmitting the punctured codeword.

5. A method for an operation of a receiver, the method comprising:
   receiving a punctured codeword;
   determining a number of bits punctured in Low Density Parity Check (LDPC) parity bits of the punctured codeword;
   determining a number ($N_{punc\_group}$) of parity bit groups in which all bits are punctured;
   setting LDPC decoder input values corresponding to all parity bits within $0^{th}$ to $(N_{punc\_group}-1)^{th}$ parity bit groups in an LDPC codeword indicated by a puncturing pattern by a value representing punctured parity bits; and
   setting LDPC decoder input values for the non-punctured remnant parity bits in the LDPC codeword according to reception values of the punctured codeword,
   wherein the puncturing pattern is defined as an order of the parity bit groups defined as 29, 45, 43, 27, 32, 35, 40, 38, 0, 19, 8, 16, 41, 4, 26, 36, 30, 2, 13, 42, 46, 24, 37, 1, 33, 11, 44, 28, 20, 9, 34, 3, 17, 6, 21, 14, 23, 7, 22, 47, 5, 10, 12, 15, 18, 25, 31 and 39.

6. The method of claim 5, wherein each of the parity bit groups includes a pre-defined number of bits which is a divisor of an interval in which a pattern of a column is repeated in a parity part matrix of a parity check matrix.

7. The method of claim 5, further comprising:
   setting LDPC decoder input values corresponding to some bits in the $N_{punc\_group}{}^{th}$ parity bit group in the LDPC codeword by a value representing the punctured parity bits.

8. An apparatus for a transmitter, the apparatus comprising:
   a coding unit for Low Density Parity Check (LDPC)-encoding LDPC information bits to generate a codeword;
   a puncturing unit for determining a number ($N_{punc}$) of bits to be punctured in parity bits of the codeword, for determining a number ($N_{punc\_group}$) of parity bit groups in which all bits are punctured, and for puncturing the all bits within $0^{th}$ to $(N_{punc\_group}-1)^{th}$ parity bit groups indicated by a puncturing pattern to create a punctured codeword; and
   a transmitter for transmitting the punctured codeword,
   wherein the puncturing pattern is defined as an order of the parity bit groups defined as 29, 45, 43, 27, 32, 35, 40, 38, 0, 19, 8, 16, 41, 4, 26, 36, 30, 2, 13, 42, 46, 24, 37, 1, 33, 11, 44, 28, 20, 9, 34, 3, 17, 6, 21, 14, 23, 7, 22, 47, 5, 10, 12, 15, 18, 25, 31 and 39.

9. The apparatus of claim 8, wherein each of the parity bit groups includes a pre-defined number of bits which is a divisor of an interval in which a pattern of a column is repeated in a parity word part matrix of the parity check matrix.

10. The apparatus of claim 8, wherein the puncturing unit punctures one or more bits in an $N_{punc\_group}{}^{th}$ parity bit group additionally.

11. An apparatus for a receiver, the apparatus comprising:
    a receiver for receiving a punctured codeword; and
    a punctured bit restoring unit for determining a number of bits punctured in Low Density Parity Check (LDPC) parity bits of the punctured codeword, determining a number ($N_{punc\_group}$) of parity bit groups in which all bits are punctured, setting LDPC decoder input values corresponding to all parity bits within $0^{th}$ to $(N_{punc\_group-1}){}^{th}$ parity bit groups in the LDPC codeword indicated by a puncturing pattern by a value representing punctured parity bits, and for setting LDPC decoder input values for non-punctured remnant parity bits in the LDPC codeword according to reception values of a shortened and punctured codeword,
    wherein the puncturing pattern is defined as an order of the parity bit groups defined as 29, 45, 43, 27, 32, 35, 40, 38, 0, 19, 8, 16, 41, 4, 26, 36, 30, 2, 13, 42, 46, 24, 37, 1, 33, 11, 44, 28, 20, 9, 34, 3, 17, 6, 21, 14, 23, 7, 22, 47, 5, 10, 12, 15, 18, 25, 31 and 39.

12. The apparatus of claim 11, wherein each of the parity bit groups includes a pre-defined number of bits which is a divisor of an interval in which a pattern of a column is repeated in a parity word part matrix of the parity check matrix.

13. The apparatus of claim 11, wherein the punctured bit restoring unit further sets LDPC decoder input values corresponding to some bits in the $N_{punc\_group}^{th}$ parity bit group in the LDPC codeword by a value representing the punctured parity bits.

* * * * *